(12) United States Patent
Hida

(10) Patent No.: US 9,220,177 B2
(45) Date of Patent: Dec. 22, 2015

(54) DISPLAY SYSTEM

(71) Applicant: FUJITSU TEN LIMITED, Kobe-shi, Hyogo (JP)

(72) Inventor: Masashi Hida, Kobe (JP)

(73) Assignee: FUJITSU TEN LIMITED, Kobe (JP)

( * ) Notice: Subject to any disclaimer, the term of this patent is extended or adjusted under 35 U.S.C. 154(b) by 86 days.

(21) Appl. No.: 14/080,018

(22) Filed: Nov. 14, 2013

(65) Prior Publication Data

US 2014/0153168 A1   Jun. 5, 2014

(30) Foreign Application Priority Data

Dec. 4, 2012 (JP) ................................. 2012-264980

(51) Int. Cl.
*H05K 7/02* (2006.01)
*B60K 35/00* (2006.01)
*B60K 37/04* (2006.01)

(52) U.S. Cl.
CPC *H05K 7/02* (2013.01); *B60K 35/00* (2013.01); *B60K 37/04* (2013.01); *B60K 2350/927* (2013.01); *Y10S 901/18* (2013.01); *Y10T 74/20329* (2015.01)

(58) Field of Classification Search
CPC .... H05K 7/02; B60K 35/00; Y10T 74/20329; Y10S 901/18
USPC ........................ 361/679.06; 455/575.1, 575.3
See application file for complete search history.

(56) References Cited

U.S. PATENT DOCUMENTS

| | | | | |
|---|---|---|---|---|
| 7,082,028 B2 * | 7/2006 | Huilgol | ................. | G06F 1/1616 248/125.1 |
| 7,257,431 B2 * | 8/2007 | Chen et al. | ................. | 455/575.3 |
| 7,403,613 B2 * | 7/2008 | Liou | ....................... | B60R 11/00 379/446 |
| 7,877,122 B2 * | 1/2011 | Yamamoto | .......... | H04M 1/0247 455/575.1 |
| 7,976,324 B2 * | 7/2011 | Fyke | ............................ | 439/260 |
| 8,400,761 B2 * | 3/2013 | Yamagiwa | ............ | H04M 1/021 16/47 |
| 8,649,166 B2 * | 2/2014 | Wu | ....................... | G06F 1/1601 361/679.27 |
| 2006/0025184 A1 * | 2/2006 | Cho | ..................... | H04M 1/0237 455/575.4 |
| 2006/0252471 A1 * | 11/2006 | Pan | ..................... | H04M 1/0237 455/575.4 |
| 2007/0287307 A1 * | 12/2007 | Park | ..................... | H04M 1/0212 439/131 |
| 2007/0290015 A1 * | 12/2007 | Rux | ......................... | B60R 9/00 224/519 |
| 2011/0063785 A1 * | 3/2011 | Yamagiwa et al. | ...... | 361/679.01 |
| 2012/0249428 A1 * | 10/2012 | Holman et al. | ............... | 345/173 |
| 2013/0068916 A1 * | 3/2013 | Mensing | ............. | F16M 11/048 248/558 |

FOREIGN PATENT DOCUMENTS

| | | |
|---|---|---|
| JP | A-9-169247 | 6/1997 |
| JP | A-9-328042 | 12/1997 |
| JP | A-2000-330475 | 11/2000 |
| JP | A-2003-069920 | 3/2003 |
| JP | A-2010-143401 | 7/2010 |
| WO | WO 2005/096710 | 10/2005 |

* cited by examiner

*Primary Examiner* — Tuan T Dinh
*Assistant Examiner* — Rockshana Chowdhury
(74) *Attorney, Agent, or Firm* — Oliff PLC

(57) ABSTRACT

A display system includes a display panel that displays information and a movement apparatus that moves the display panel. The movement apparatus includes: a slide mechanism configured to move the display panel linearly relative to a base chassis; a right-and-left tilt mechanism configured to change an angle of a display surface of the display panel in a right-and-left direction; an up-and-down tilt mechanism configured to change an angle of the display surface of the display panel in an up-and-down direction; and a rotation mechanism configured to rotate the display panel on a rotation axis orthogonal to the display surface of the display panel.

10 Claims, 23 Drawing Sheets

DISPLAY SYSTEM

BACKGROUND OF THE INVENTION

1. Field of the Invention

The invention relates to a technology that moves a display panel.

2. Description of the Background Art

Conventionally, a display system including a display panel having a navigation function and the like has been used in a vehicle. A user in the vehicle can obtain a variety of information by seeing the display panel. Moreover, generally, the display panel includes a touch panel and an operation portion so that the user can make various operations via the display panel.

Normally, a display surface of such a display panel is rectangular, and the display surface is placed such that a longer side of the display surface is laid laterally. However, when a vertically-long image is displayed on the display surface, there is a case where visibility is improved if the display panel is placed such that the longer side of the display surface stands longitudinally. Therefore, a technology that allows the user to rotate the display panel manually by providing a rotation axis orthogonal to the display surface to rotate the display panel, has been proposed.

Such a display system as mentioned above is installed in/on a predetermined installation area in a cabin of a vehicle. However, a position and an angle of the installation area are determined with priority on interior design of the cabin. Therefore, when the display system is installed in the installation area, a position and an angle of the display panel may not be suitable for the user (mainly driver) to see and operate the display panel.

Even if the user uses the technology mentioned above and rotates the display panel, using the rotation axis orthogonal to the display surface, there are many cases where the position and the angle of the display panel are not suitable for the user.

SUMMARY OF THE INVENTION

According to one aspect of the invention, a display system includes: a display panel that displays information; a linearly-moving mechanism configured to move the display panel linearly relative to a support structure of the display system; a right-and-left changing mechanism configured to change an angle of a display surface of the display panel in a right-and-left direction; an up-and-down changing mechanism configured to change an angle of the display surface of the display panel in an up-and-down direction that is orthogonal to the right-and-left direction; and a rotation mechanism configured to rotate the display panel on a rotation axis orthogonal to the display surface of the display panel.

A position and an angle of the display panel can be as desired by a user.

Moreover, according to another aspect of the invention, the linearly-moving mechanism includes a first slider, the right-and-left changing mechanism includes a second slider, the up-and-down changing mechanism includes a third slider, and each of the first, second and third sliders moves the display panel by moving linearly substantially parallel to a base surface of the support structure.

Since all the sliders of the linearly-moving mechanism, the right-and-left changing mechanism and the up-and-down changing mechanism move substantially parallel to the base surface of the support structure, the linearly-moving mechanism, the right-and-left changing mechanism and the up-and-down changing mechanism can be stacked on top of each other to be provided to the support structure. Therefore, mechanisms that move along with the display panel can be reduced, and thus a weight to be moved by a movement apparatus can be reduced.

Further, according to another aspect of the invention, the right-and-left changing mechanism includes: a rotation member that rotates; and a base member that defines a fixed direction of a rotation axis of the rotation member. The up-and-down changing mechanism is provided to a side of the rotation member and the linearly-moving mechanism is provided to a side of the base member.

Since the linearly-moving mechanism is provided to the side of the base member that defines a fixed direction of the rotation axis of the right-and-left changing mechanism, the fixed direction of the rotation axis of the right-and-left changing mechanism is not affected by movement of the up-and-down changing mechanism. Therefore, the fixed direction of the rotation axis of the right-and-left changing mechanism can be constant. Thus, even after the right-and-left changing mechanism moves, movement of the display panel can be consistent.

Therefore, an object of the invention is to change a position and an angle of a display panel as desired by a user.

These and other objects, features, aspects and advantages of the invention will become more apparent from the following detailed description of the invention when taken in conjunction with the accompanying drawings.

DESCRIPTION OF THE EMBODIMENTS

<1. Outline of Display System>

An embodiment of the invention is hereinafter explained with reference to the drawings.

Figure 1:
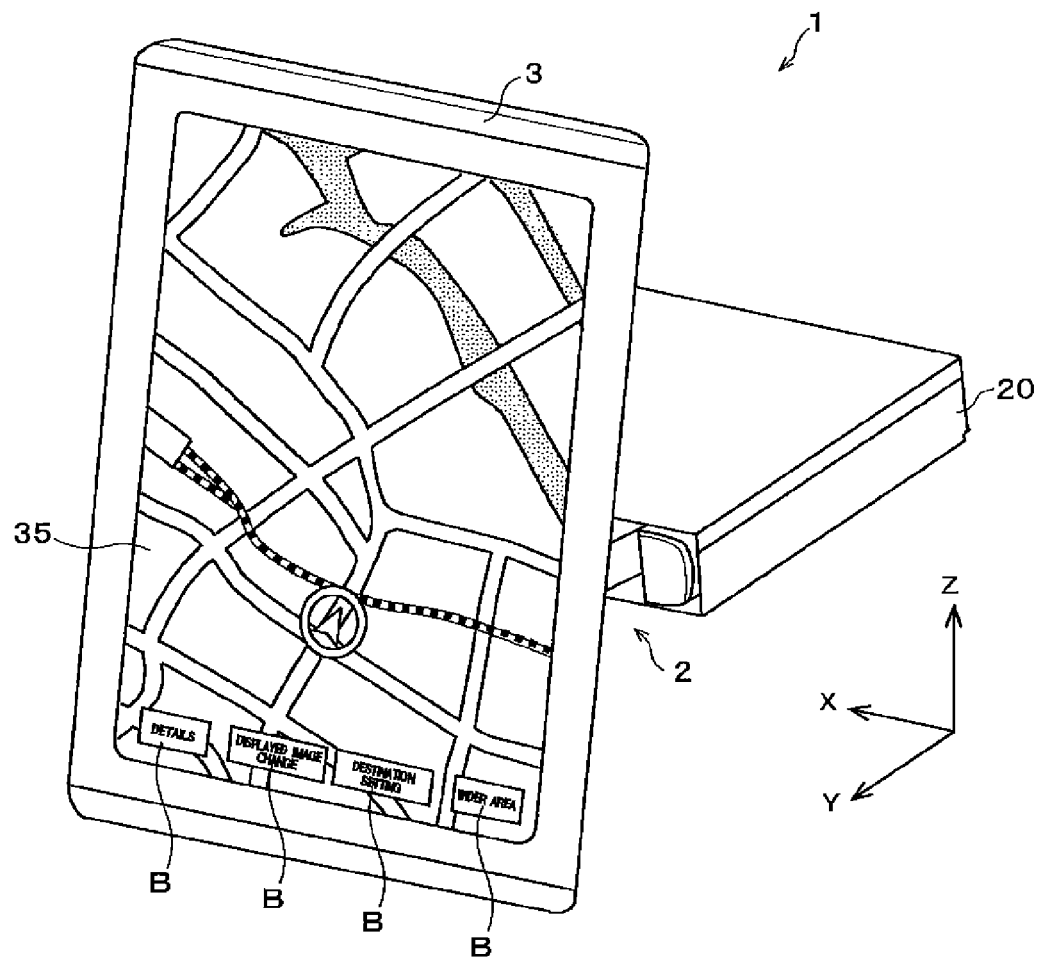
FIG. 1 shows a perspective view of an external appearance of a display system.

FIG. 1 shows a perspective view of an external appearance of a display system 1 that is an embodiment of the invention. The display system 1 is, for example, a vehicle-mounted apparatus that is mounted in a vehicle, such as a car, to be used in a cabin of the vehicle. The display system 1 includes, for example, a navigation function that provides a route to a destination, an audio function that outputs sound in the cabin, etc.

The display system 1 includes a display panel 3 that displays a variety of information and a base chassis 20 that is a support structure of the entire display system 1.

The display panel 3 is a thin display apparatus that includes a display 35, such as a liquid crystal display, as a display surface. The display surface of the display panel 3 is substantially rectangular having a longer side and a shorter side. A user (mainly a driver) in the vehicle can obtain a variety of information by seeing the display 35 of the display panel 3.

Moreover, the display 35 includes a touch panel and can receive a user operation. The user can give various commands to the display system 1 by touching a command button B and the like displayed on the display 35.

The base chassis 20 is fixed to the vehicle and supports the entire display system 1. In the explanation below, a three dimensional Cartesian coordinate system (X, Y, and Z) shown in the drawings is used to appropriately show a direction and an angle. The Cartesian coordinate system is fixed relative to the base chassis 20. An X-axis represents a right-and-left direction. A Y-axis represents a back-and-forth direction. A Z-axis represents an up-and-down direction. A +X side represents a left side of the display surface of the display panel 3, and a −X side represents a right side of the display surface of the display panel 3. Moreover, a +Y side represents a front side of the display surface, and a −Y side represents a back side of the display surface. A +Z side represents an upper side and a −Z side represents a lower side.

Figure 2:
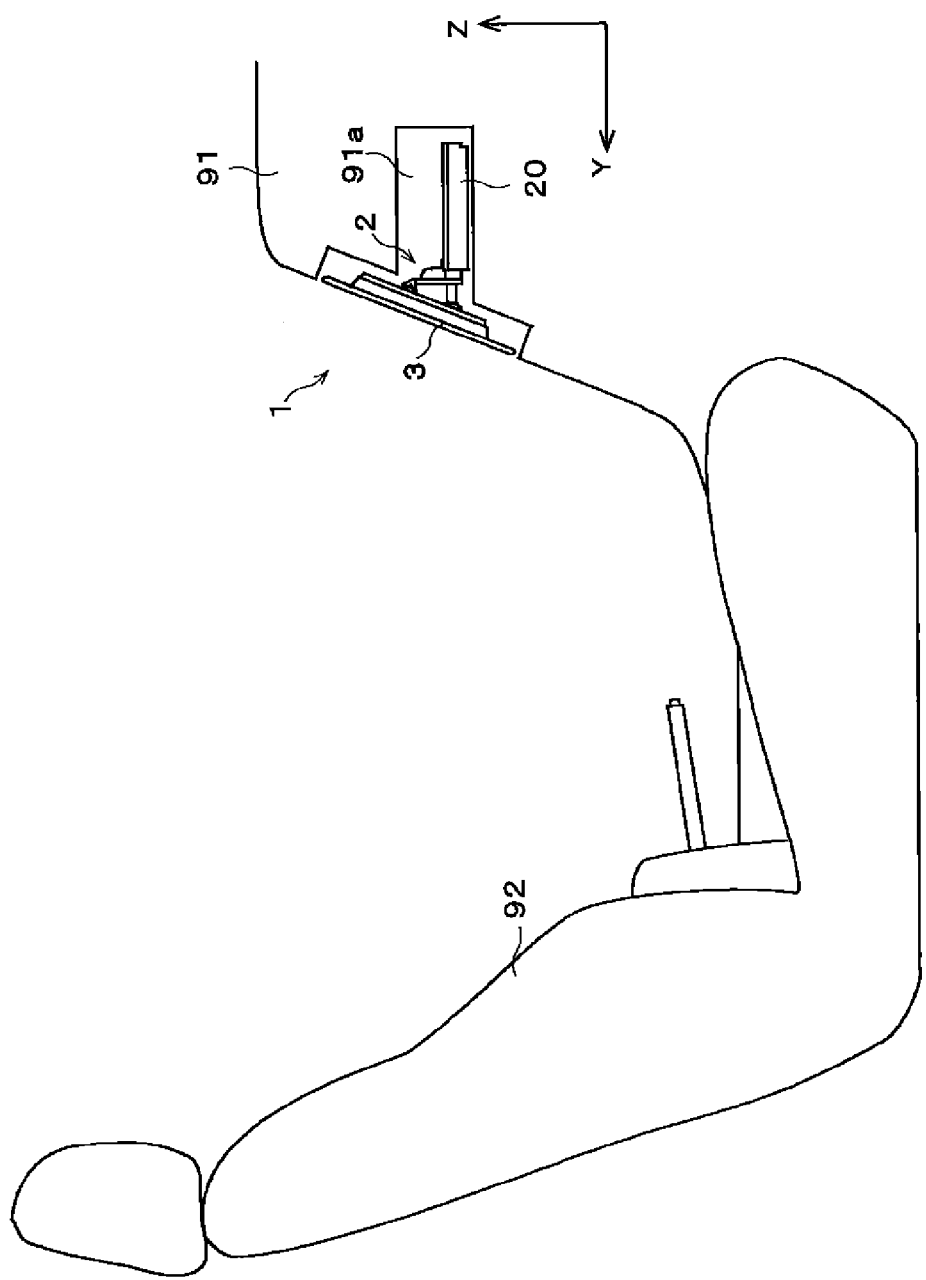
FIG. 2 shows a view of a cabin of a vehicle.

FIG. 2 is a right side view of the cabin of the vehicle in which the display system 1 is mounted. A front side of the vehicle is on a right side in FIG. 2. As shown in FIG. 2, the display system 1 is mounted in an installation portion 91a that is an opening formed in a dashboard 91 on a front side of the cabin. The user in a seat 92 of the vehicle uses the display system 1 mounted in the installation portion 91a.

The base chassis 20 of the display system 1 housed in the installation portion 91a is fixed to the dashboard 91 (i.e. the vehicle) by a fastener or the like. In this embodiment, the base chassis 20 is fixed such that a bottom of the base chassis 20 is parallel to a substantially horizontal direction. Therefore, the X-axis and the Y-axis run substantially parallel to the horizontal direction, and the Z-axis runs substantially parallel to a vertical direction.

Moreover, in an initial state, the display panel 3 is housed in the installation portion 91a with the display surface facing an inside of the cabin (a rear side of the vehicle). Therefore, in the initial state, the display surface of the display panel 3 is not uneven but flat with a surface of the dashboard 91. The surface of the dashboard 91 is slightly tilted relative to the vertical direction. Therefore, in the initial state, the display surface of the display panel 3 is tilted slightly upwards relative to the vertical direction. Moreover, as shown in FIG. 1, in the initial state, a posture of the display panel 3 is a portrait mode posture in which the shorter side of the display surface runs parallel to the right-and-left direction (the X-axis direction).

<2. Outline of Movement Apparatus>

Figure 3:
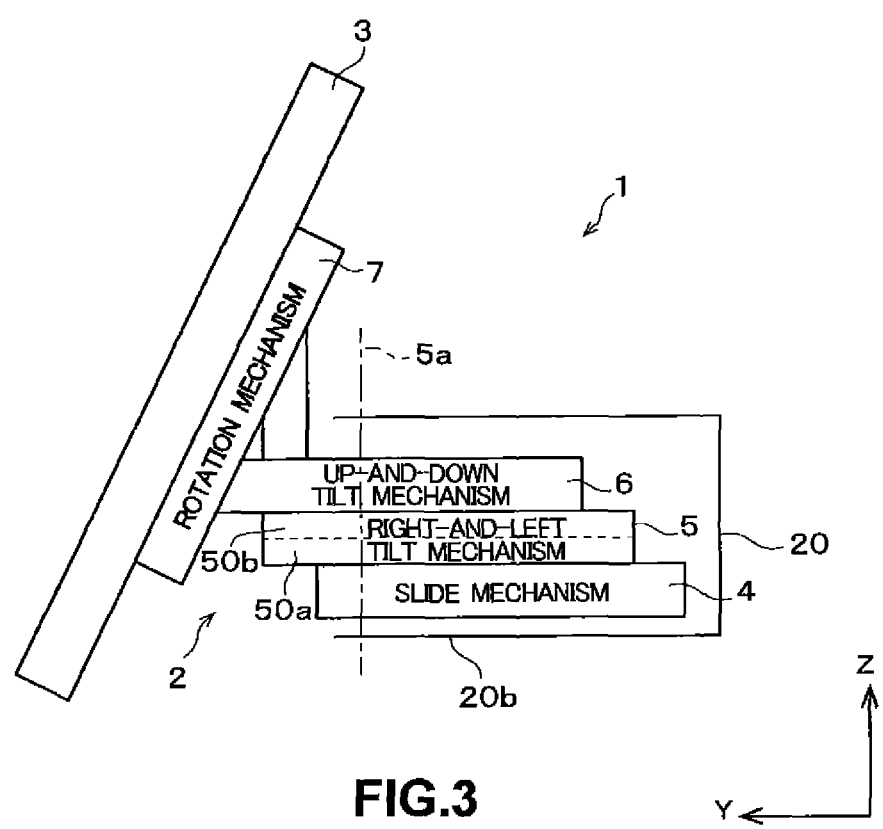
FIG. 3 shows an outline structure of the display system.

FIG. 3 shows an outline structure of the display system 1 viewed from a right side (the −X side). As shown in FIG. 3, the display system 1 includes a movement apparatus 2 that moves the display panel 3 to change a position, an angle and a posture of the display panel 3 placed in the initial state. The movement apparatus 2 is provided between the base chassis 20 and the display panel 3. The base chassis 20 fixed to the vehicle serves as a reference position used by the movement apparatus 2 to move the display panel 3. The movement apparatus 2 includes a slide mechanism 4, a right-and-left tilt mechanism 5, an up-and-down tilt mechanism 6 and a rotation mechanism 7.

Figure 4:
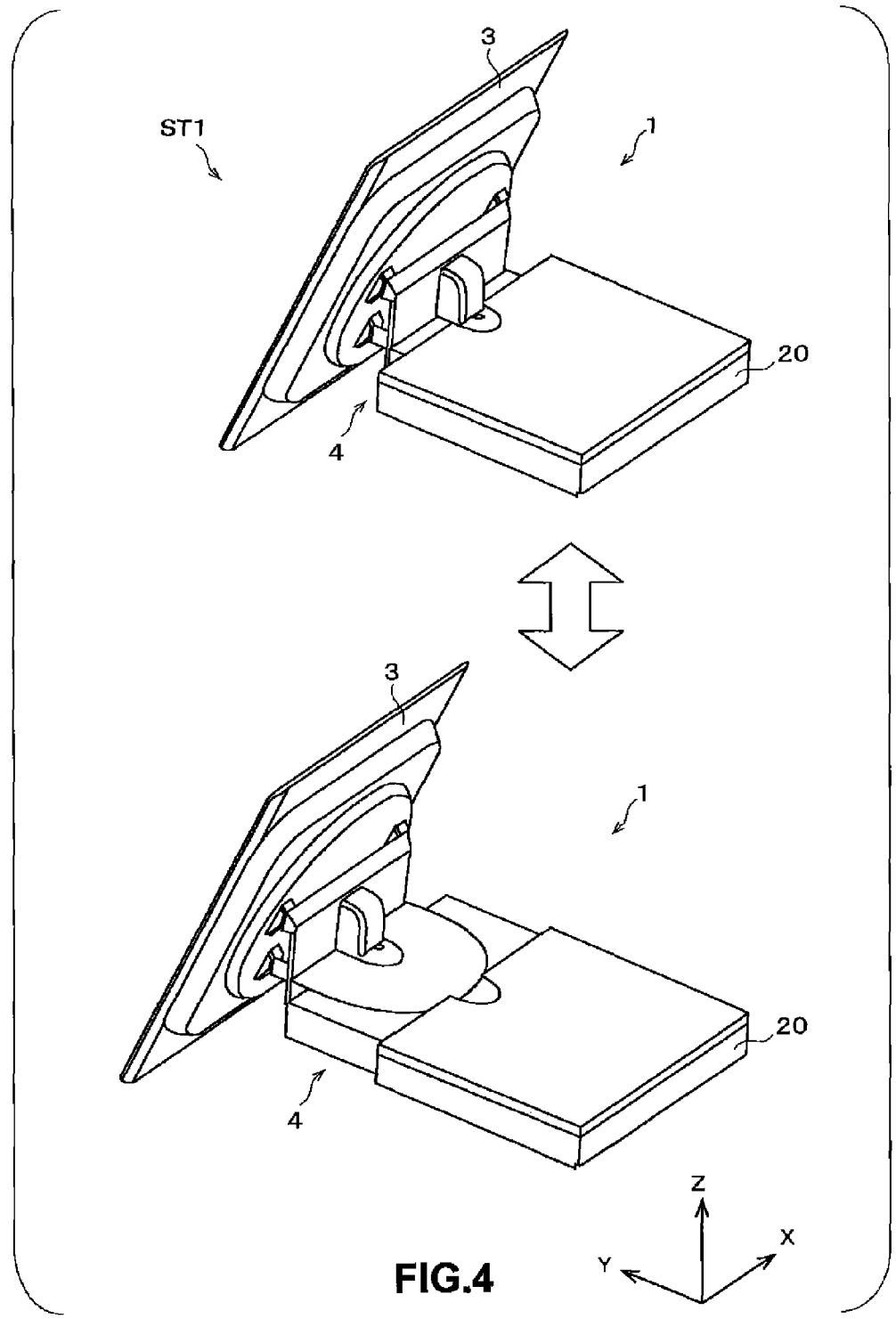
FIG. 4 shows an outline of drive of a slide mechanism.

FIG. 4 shows an outline of drive of the slide mechanism 4. As shown in FIG. 4, the slide mechanism 4 moves the display panel 3 linearly relative to the base chassis 20 that is the support structure of the display system 1. The slide mechanism 4 moves the display panel 3 in the back-and-forth direction (the Y-axis direction) relative to the base chassis 20. Thus, the slide mechanism 4 moves the display panel 3 from a position of an initial state ST1 of the display panel 3 housed in the installation portion 91a to a position projecting to the inside of the cabin of the vehicle (the +Y side).

Figure 5:
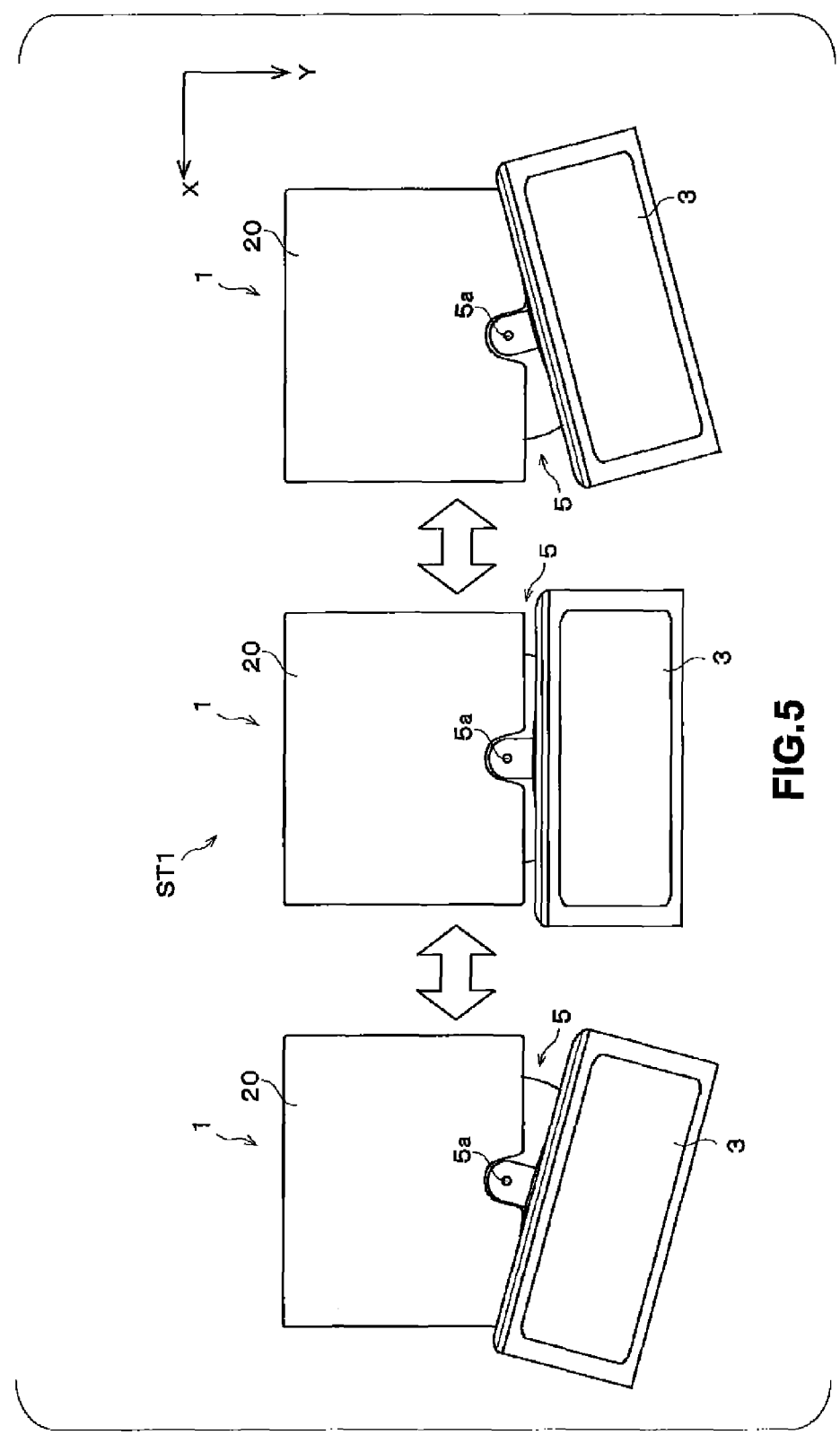
FIG. 5 shows an outline of drive of a right-and-left tilt mechanism.

FIG. 5 shows an outline of drive of the right-and-left tilt mechanism 5. As shown in FIG. 5, the right-and-left tilt mechanism 5 changes an angle of the display surface of the display panel 3 in the right-and-left direction. The right-and-left tilt mechanism 5 rotates (pans) the display panel 3 in the right-and-left direction (the X-axis direction) on a rotation axis 5a parallel to the up-and-down direction (the Z-axis direction). Thus, the right-and-left tilt mechanism 5 can change the angle of the display surface of the display panel 3 from the initial state ST1 where the display surface faces the front (an angle where the display surface is parallel to the right-and-left direction) to right or left. The right-and-left tilt mechanism 5 may be regarded as a pan mechanism to move the display panel 3 in the right-and-left direction (the X-axis direction).

Figure 6:
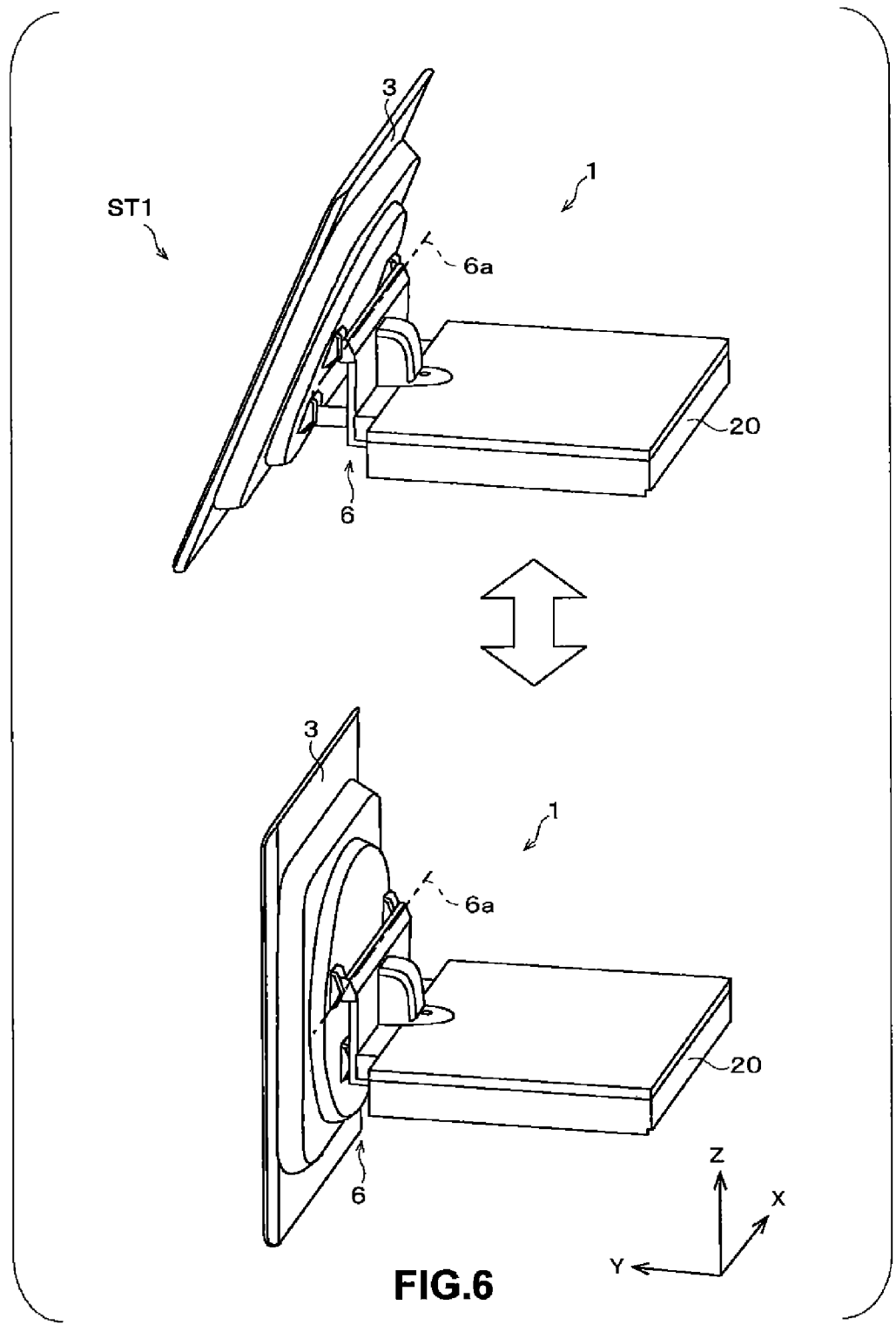
FIG. 6 shows an outline of drive of an up-and-down tilt mechanism.

FIG. 6 shows an outline of drive of the up-and-down tilt mechanism 6. As shown in FIG. 6, the up-and-down tilt mechanism 6 changes the angle of the display surface of the display panel 3 in the up-and-down direction. The up-and-down tilt mechanism 6 rotates (tilts) the display panel 3 in the up-and-down direction (the Z-axis direction) on a rotation axis 6a parallel to the right-and-left direction (the X-axis direction). Thus, the up-and-down tilt mechanism 6 can change the angle of the display surface of the display panel 3 from the initial state ST1 where the display surface is tilted upward to an angle where the display surface faces front (an angle where the display surface is parallel to the vertical direction). The up-and-down tilt mechanism 6 may be regarded as a tilt mechanism because the up-and-down tilt mechanism 6 moves the display panel 3 in the up-and-down direction (the Z-axis direction).

Figure 7:
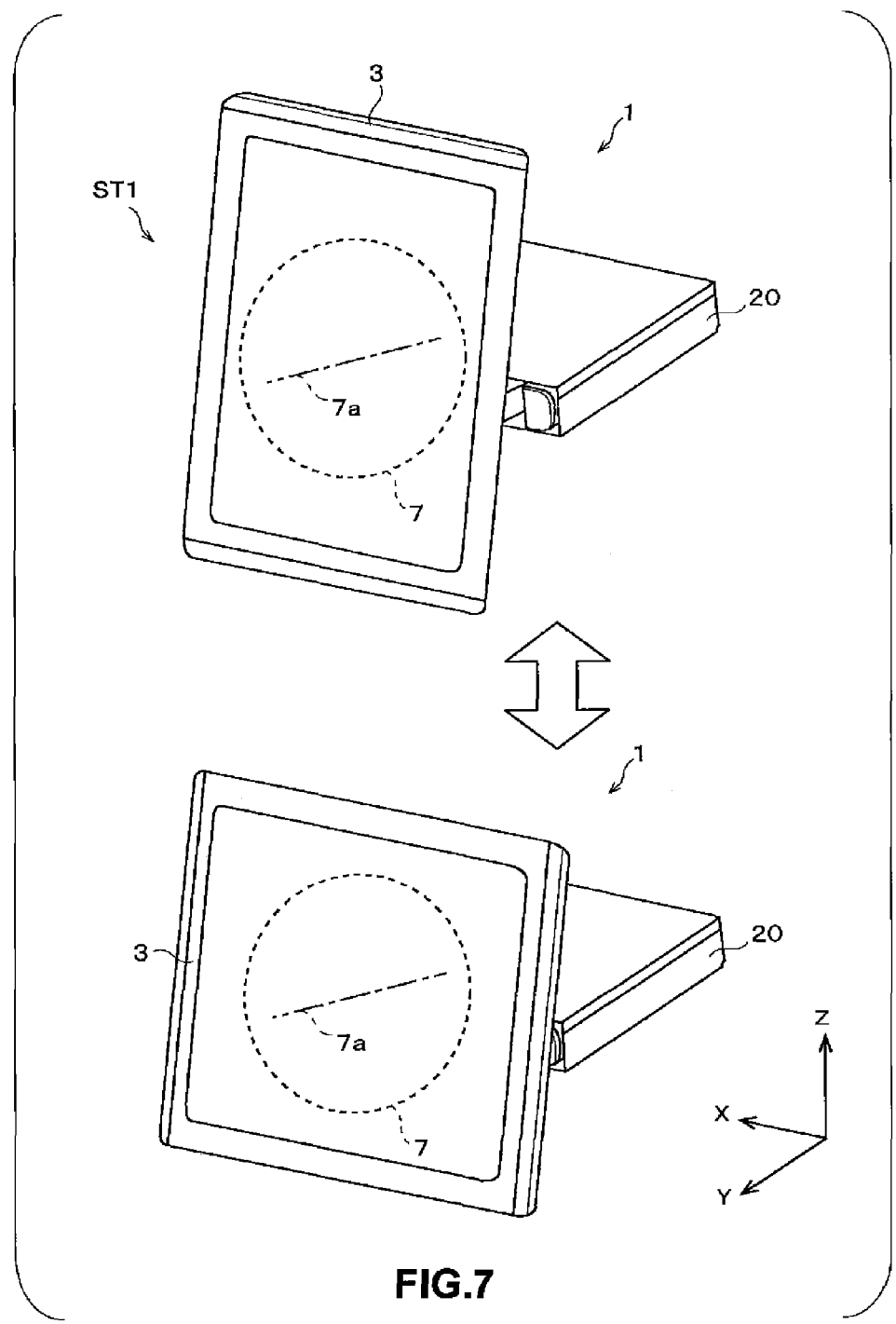
FIG. 7 shows an outline of drive of a rotation mechanism.

FIG. 7 shows an outline of drive of the rotation mechanism 7. As shown in FIG. 7, the rotation mechanism 7 rotates (roll) the display panel 3 on a rotation axis 7a orthogonal to the display surface. Thus, the rotation mechanism 7 can change the posture of the display panel 3 from the initial state ST1 of the portrait mode posture where the shorter side of the display surface is parallel to the right-and-left direction (the X-axis direction) to a landscape mode posture where the longer side of the display surface is parallel to the right-and-left direction.

These slide mechanism 4, right-and-left tilt mechanism 5, up-and-down tilt mechanism 6 and rotation mechanism 7 work separately from one another. Therefore, the position, the angle and the posture of the display panel 3 of the display system 1 can be as desired by the user. Thus, visibility and operability of the display panel 3 can be improved.

Moreover, as shown in FIG. 3, the slide mechanism 4, the right-and-left tilt mechanism 5 and the up-and-down tilt mechanism 6 are stacked on top of each other. The slide mechanism 4 is provided on a bottom surface 20b of the base chassis 20. The right-and-left tilt mechanism 5 is provided on the slide mechanism 4, and the up-and-down tilt mechanism 6 is provided on the right-and-left tilt mechanism 5. The base chassis 20 can be regarded as a support structure that supports the movement apparatus 2. In the initial state ST1, most portion of the slide mechanism 4, the right-and-left tilt mechanism 5, and the up-and-down tilt mechanism 6 are housed in the base chassis 20. The base chassis 20 functions as a box-type housing that contains the mechanisms.

On the other hand, the rotation mechanism 7 is provided on a back side (the −Y side) of the display panel 3. Among the four mechanisms included in the movement apparatus 2, only the rotation mechanism 7 is provided on the back side of the display panel 3. Thus, the back side of the display panel 3 is thin and design of external appearance of the display panel 3 can be improved. Moreover, since only the rotation mechanism 7 moves along with the display panel 3, a weight to be moved by the movement apparatus 2 to move the display panel 3 can be reduced. As a result, burden to each mechanism of the movement apparatus 2 can be reduced.

The right-and-left tilt mechanism 5 includes a base member 50a that defines a fixed direction of the rotation axis 5a and a rotation member 50b that rotates on the rotation axis 5a (details are later described). The slide mechanism 4 is provided on a side of the base member 50a and the up-and-down tilt mechanism 6 is provided on a side of the rotation member 50b. As a result, the movement apparatus 2 is configured such that the right-and-left tilt mechanism 5 moves with reference to the slide mechanism 4, and such that the up-and-down tilt mechanism 6 moves with reference to the right-and-left tilt mechanism 5. Due to the configuration mentioned above, as shown in FIG. 8, the fixed direction of the rotation axis 5a of the right-and-left tilt mechanism 5 is not affected or changed by movement, of the up-and-down tilt mechanism 6.

Figure 9:
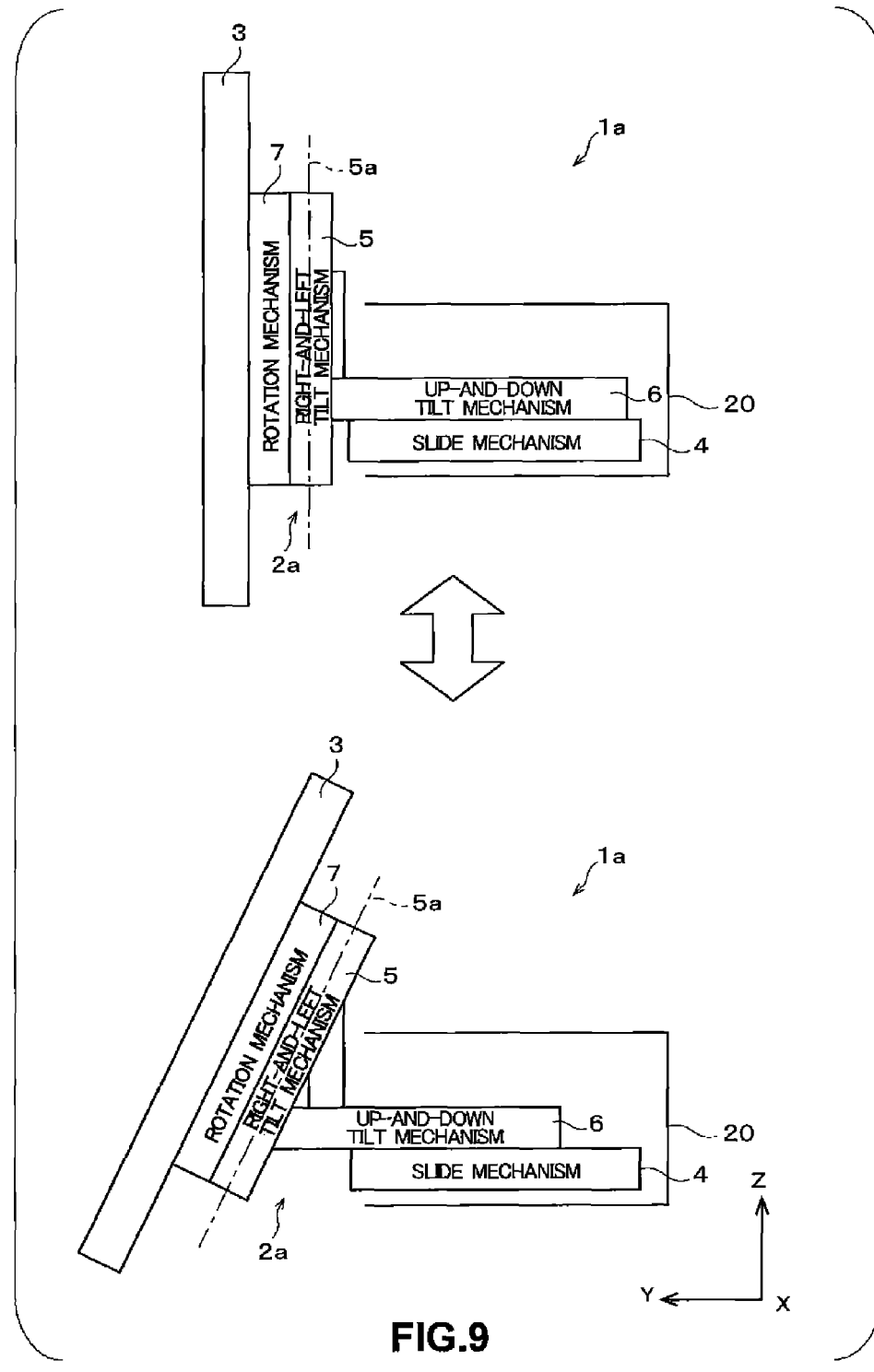
FIG. 9 shows a schematic structure of a display system that is a comparative example.

FIG. 9 shows a schematic structure of a display system 1a that is a comparative example. The comparative example display system 1a includes a movement apparatus 2a in a configuration where the up-and-down tilt mechanism 6 moves with reference to the slide mechanism 4 and where the right-and-left tilt mechanism 5 moves with reference to the up-and-down tilt mechanism 6. In this configuration, the fixed direction of the rotation axis 5a of the right-and-left tilt mechanism 5 is affected by movement of the up-and-down tilt mechanism 6. In other words, as shown in FIG. 9, when the up-and-down tilt mechanism 6 moves, the fixed direction of the rotation axis 5a of the right-and-left tilt mechanism 5 is changed.

When the fixed direction of the rotation axis 5a of the right-and-left tilt mechanism 5 is changed as shown above, a direction in which the right-and-left tilt mechanism 5 changes the angle of the display surface of the display panel 3 is changed. Therefore, movement of the display panel 3 moved by the right-and-left tilt mechanism 5 is not stable and the display panel 3 may make an unexpected movement for the user.

When causing the right-and-left tilt mechanism 5 to move, the user expects the display panel 3 only to move horizontally (the X-axis direction). However, for example, as shown in a lower drawing of FIG. 9, in a case where the right-and-left tilt mechanism 5 is moved in a state where the fixed direction of the rotation axis 5a is not vertical, the display panel 3 moves not only horizontally (the X-axis direction) but also in the up-and-down direction (the Z-axis direction). Such movement of the display panel 3 is not expected by the user and may cause the user uneasy. Moreover, whenever the up-and-down tilt mechanism 6 is moved, an angle of movement of the display panel 3 moved by the right-and-left tilt mechanism 5 is changed. Therefore, the display panel 3 makes the unexpected movement for the user.

Figure 8:
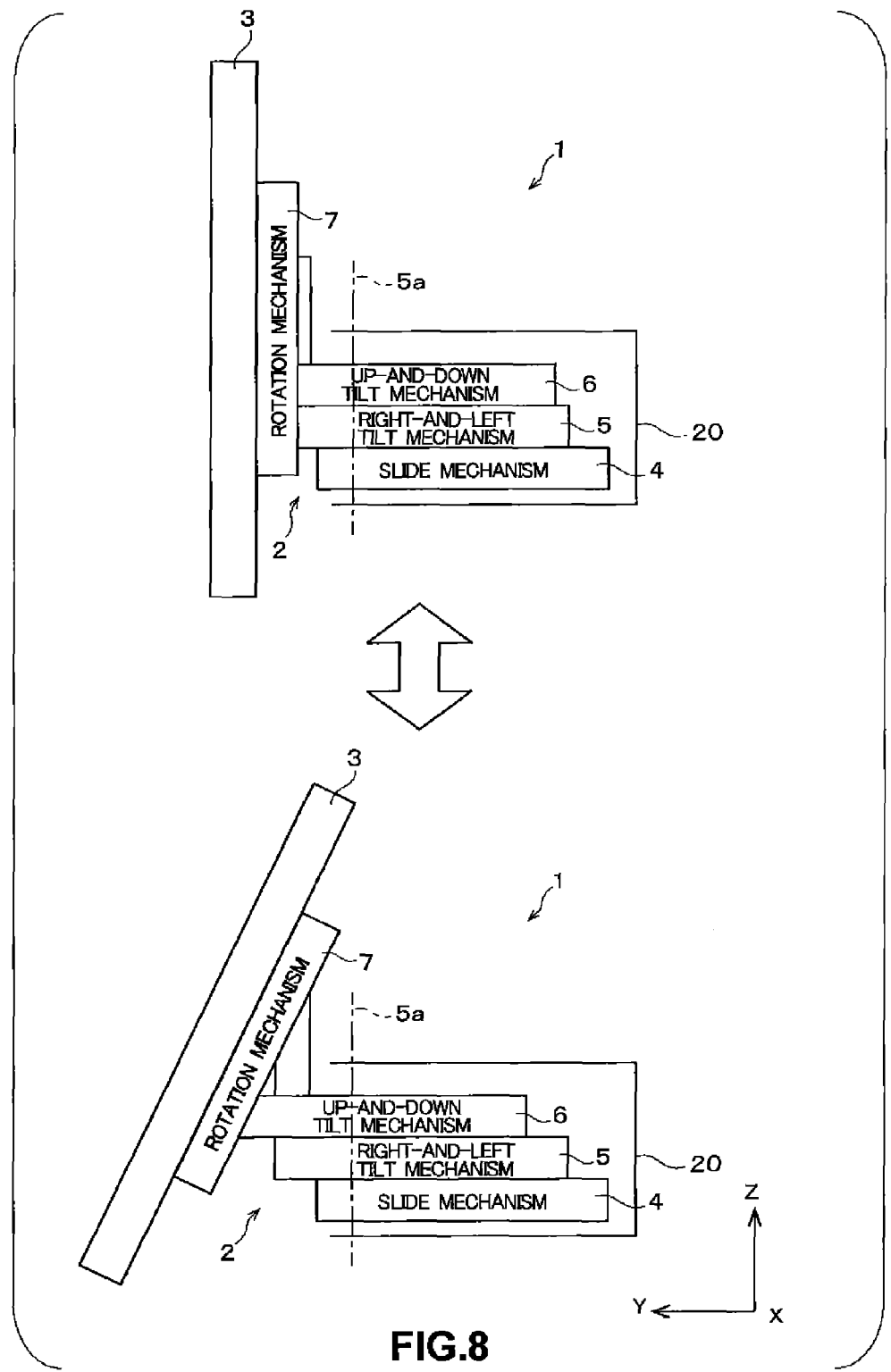
FIG. 8 shows a schematic structure of the display system of this embodiment.

On the other hand, in a case of the configuration of the movement apparatus 2 in this embodiment as shown in FIG. 8, the fixed angle of the rotation axis 5a of the right-and-left tilt mechanism 5 is not affected by the movement of the up-and-down tilt mechanism 6. Therefore, even when the up-and-down tilt mechanism 6 moves, the fixed direction of the rotation axis 5a of the right-and-left tilt mechanism 5 is consistent. Thus, the movement of the display panel 3 is consistent even when the right-and-left tilt mechanism 5 is moved, and it is possible to prevent the display panel 3 from making the unexpected movement for the user.

Detailed configurations of the slide mechanism 4, the right-and-left tilt mechanism 5, the up-and-down tilt mechanism 6 and the rotation mechanism 7 included in the movement apparatus 2 are hereinafter explained individually.

<3. Slide Mechanism>

Figure 10:
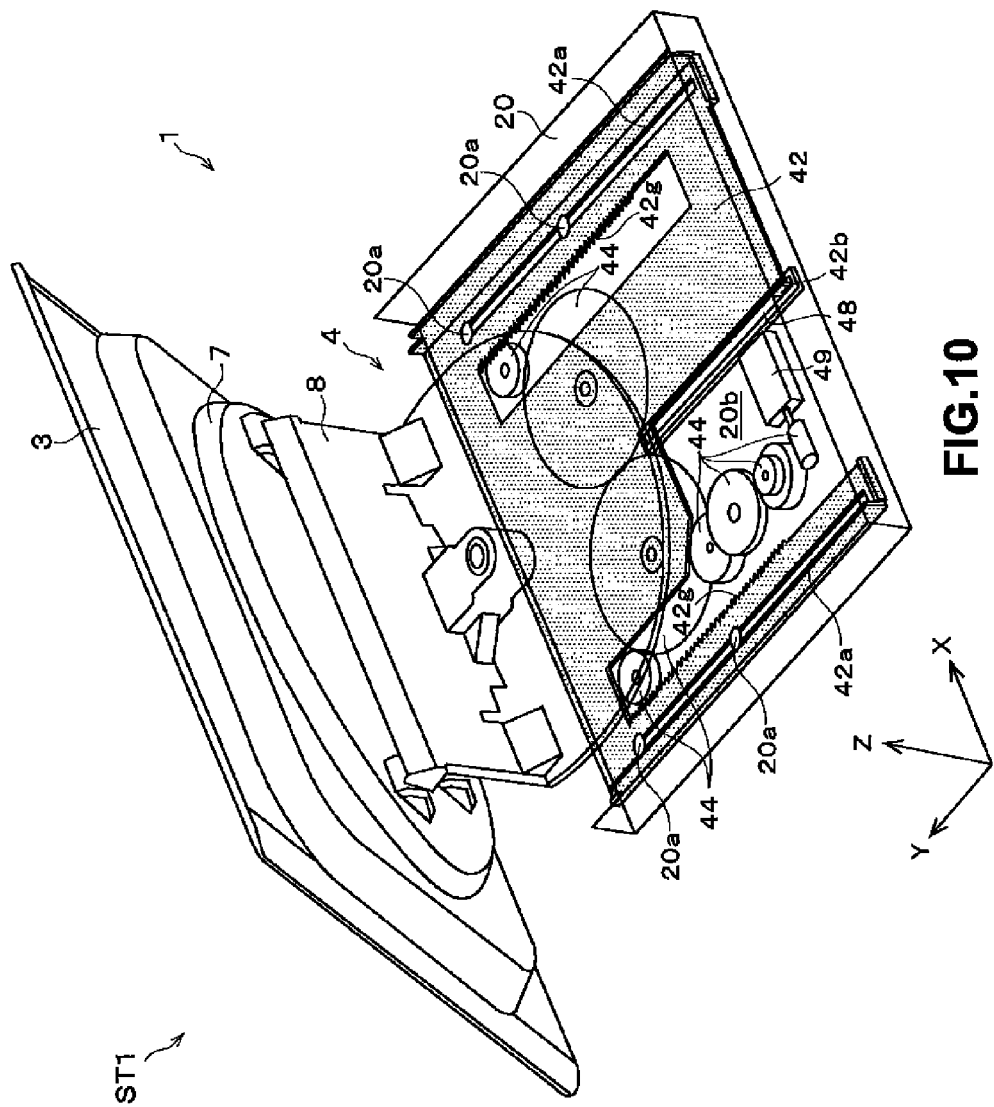
FIG. 10 mainly shows a configuration of the slide mechanism.
Figure 11:
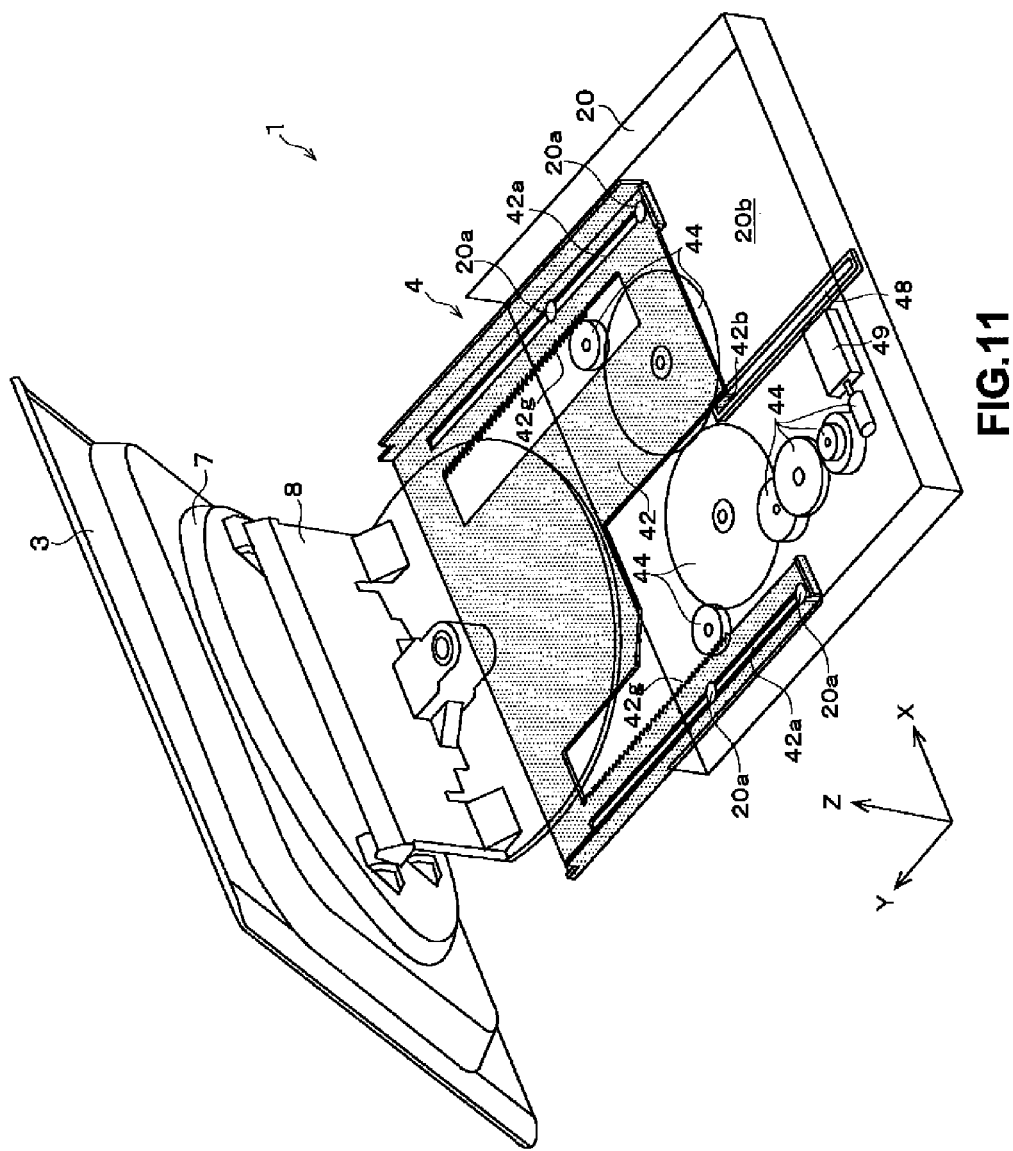
FIG. 11 mainly shows the configuration of the slide mechanism.

A configuration of the slide mechanism 4 is first described. FIGS. 10 and 11 mainly show the configuration of the slide mechanism 4. FIG. 10 shows the initial state ST1. On the other hand, FIG. 11 shows a state of the display panel 3 moved by the slide mechanism 4 from the initial state ST1. For convenience of explanation, in these drawings, the configuration is shown through some members, and part of the configuration, other than the slide mechanism 4, is omitted from the drawings.

As shown in FIG. 10, the slide mechanism 4 includes a slider 42 that moves linearly relative to the base chassis 20. The base chassis 20 functions as a base member that is a base of movement of the slider 42.

The slider 42 includes two guide grooves 42a running in the back-and-forth direction (the Y-axis direction). Moreover, a fixed shaft 20a fixed to the base chassis 20 is fitted in each of the two guide grooves 42a. Therefore, the slider 42 moves in the back-and-forth direction (the Y-axis direction) along the two guide grooves 42a. Thus, the slider 42 moves substantially parallel to the bottom surface 20b of the base chassis 20.

The display panel 3 is connected to a support chassis 8 on the back side of the display panel 3 and is supported by the support chassis 8. The support chassis 8 moves together with the slider 42. Therefore, when the slider 42 moves linearly relative to the base chassis 20, the display panel 3 also moves linearly relative to the base chassis 20 by a same distance and in a same direction.

For example, when the slider 42 moves to the front side (the +Y side) from the initial state ST1 shown in FIG. 10, the slider 42 is located at a position projecting to the front side (the +Y side). Contrarily, when the slider 42 moves to the back side (the −Y side), as shown in FIG. 11, the display panel 3 returns to the initial state ST1, located on the back side (the −Y side) of the display panel 3.

Moreover, the slide mechanism 4 includes a motor 49 that is a driving source to generate driving force and a plurality of gears 44 that convey the driving force of the motor 49. The motor 49 and the plurality of gears 44 are provided to the bottom surface 20b of the base chassis 20.

Further, the slider 42 includes two rack gears 42g parallel to the back-and-forth direction (the Y-axis direction). Each of the two rack gears 42g engages with one of the plurality of gears 44. Therefore, the driving force of the motor 49 is conveyed to the slider 42 via the plurality of gears 44. As the motor 49 rotates, the slider 42 moves along the two guide grooves 42a in the back-and-forth direction (the Y-axis direction).

In addition, the slide mechanism 4 includes a position sensor 48 that detects a position of the display panel 3 moved by the slide mechanism 4. The position sensor 48 is, for example, a variable resistor, and is provided to the bottom surface 20b of the base chassis 20 and extends in the back-and-forth direction (the Y-axis direction). The position sensor 48 is connected to a projecting portion 42b of the slider 42, and the projecting portion 42b functions as a movable terminal of the variable resistor. Thus, the position sensor 48 detects a position of the slider 42 based on a resistance value that changes according to a position of the projecting portion 42b. The position of the slider 42 is equivalent to the position of the display panel 3 moved by the slide mechanism 4.

The display system 1 can move the slider 42 of the slide mechanism 4 to an arbitrary position within a movable range of the slider 42, by using such a position sensor like the position sensor 48. In other words, the display system 1 can move the display panel 3 to an arbitrary position within a range where the slide mechanism 4 can move the display panel 3. Moreover, the display system 1 can detect the position of the slider 42 by using the position sensor 48 when the display system 1 is turned on.

<4. Right-and-Left Tilt Mechanism>

Figure 12:
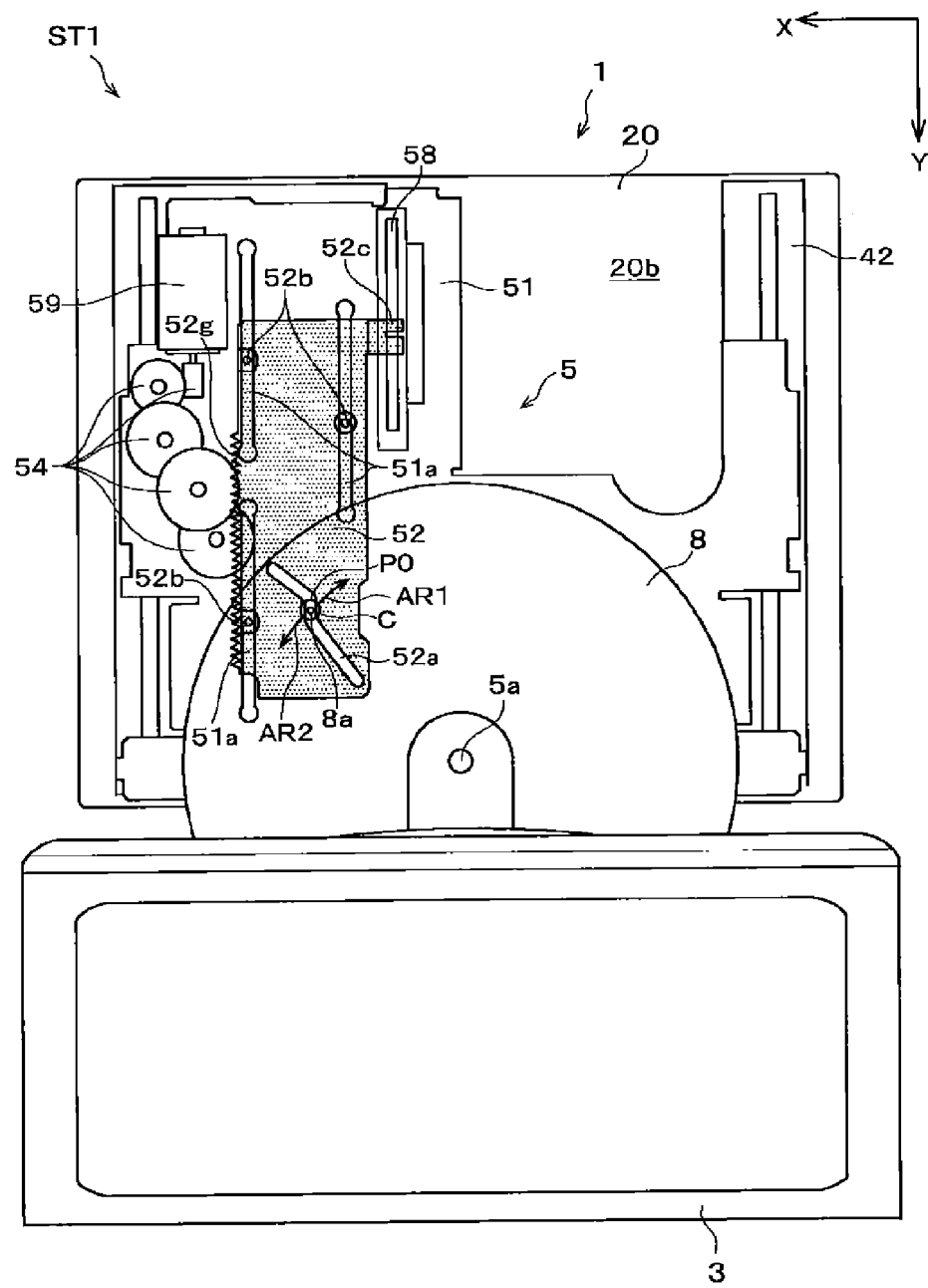
FIG. 12 mainly shows a configuration of the right-and-left tilt mechanism.
Figure 13:
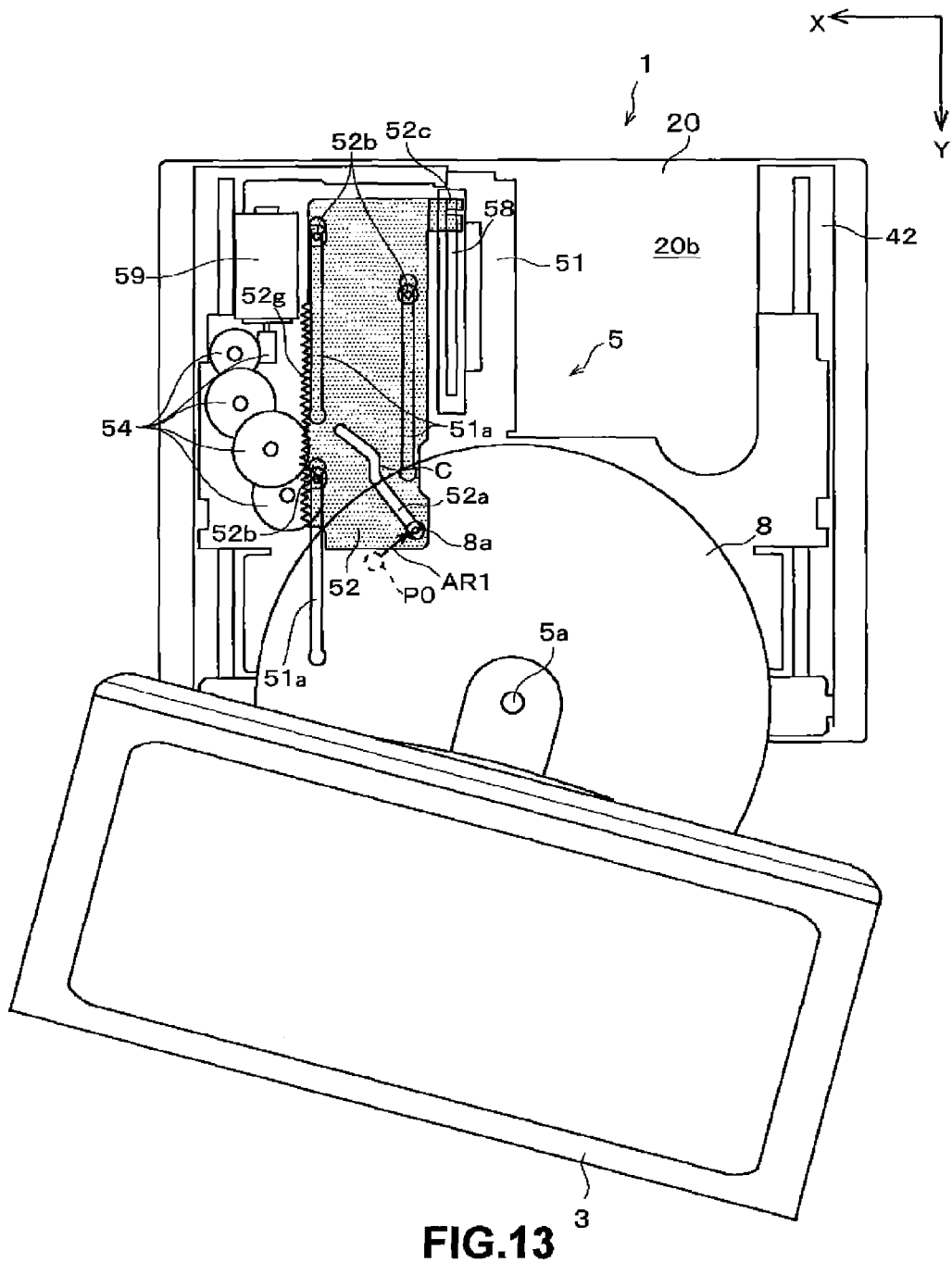
FIG. 13 mainly shows the configuration of the right-and-left tilt mechanism.
Figure 14:
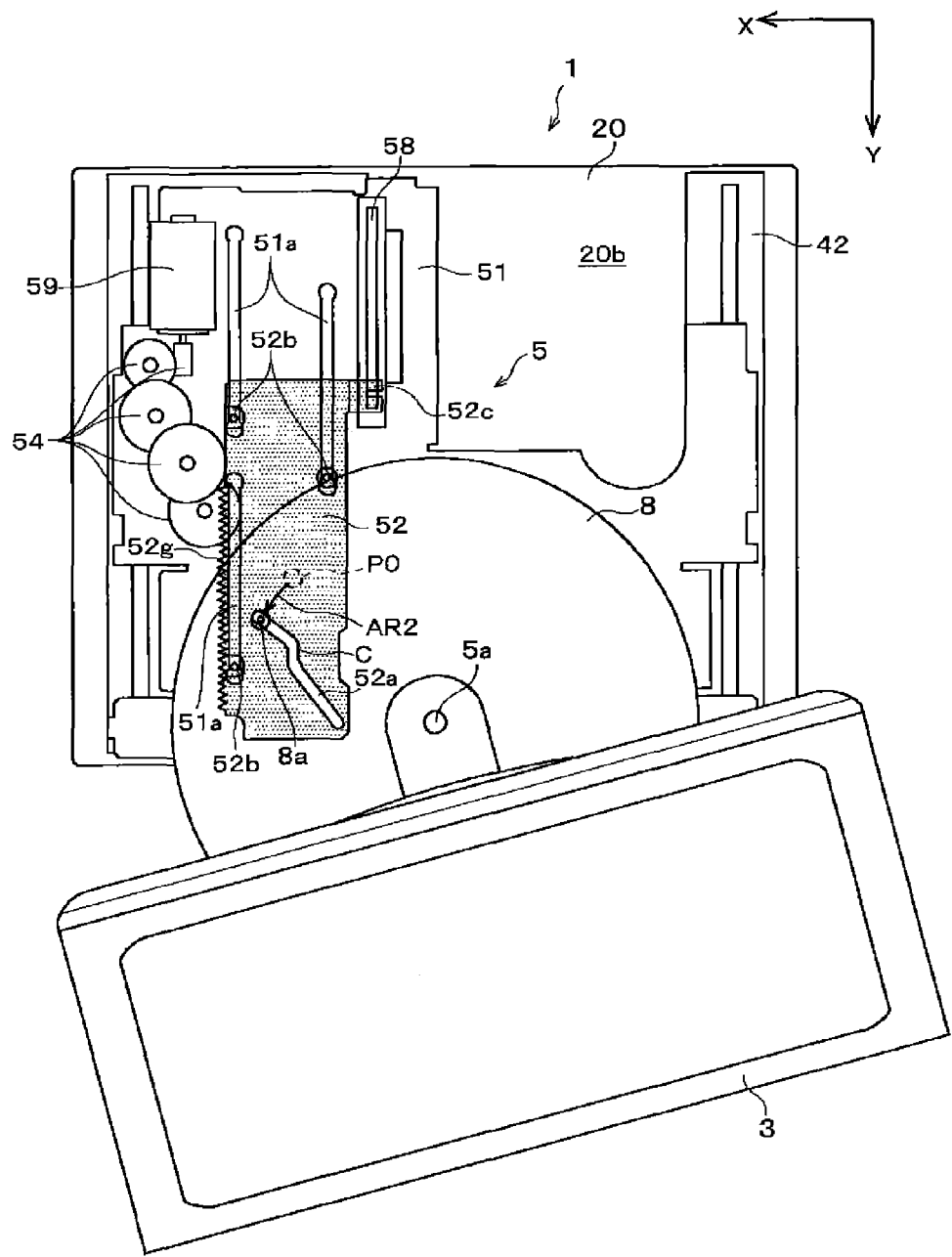
FIG. 14 mainly shows the configuration of the right-and-left tilt mechanism.

Next, a configuration of the right-and-left tilt mechanism 5 is explained. FIGS. 12 to 14 mainly show the configuration of the right-and-left tilt mechanism 5. FIG. 12 shows the initial state ST1. On the other hand, each of FIGS. 13 and 14 shows a state of the display panel 3 of which an angle is changed by the right-and-left tilt mechanism 5 from the initial state ST1. For convenience of explanation, in these drawings, the configuration is shown through some members, and part of the configuration, other than the right-and-left tilt mechanism 5, is omitted from the drawings.

As shown in FIG. 12, the right-and-left tilt mechanism 5 includes a base plate 51, a base member, and a slider 52 that moves linearly relative to the base plate 51. Moreover, the support chassis 8 that supports the display panel 3 on the back side of the display panel 3 functions as a rotation member of the right-and-left tilt mechanism 5 and rotates on the rotation axis 5a defined by the base plate 51. The base plate 51 is equivalent to the base member 50a explained with reference to FIG. 3 and the support chassis 8 is equivalent to the rotation member 50b explained with reference to FIG. 3.

The base plate 51 is provided parallel to the bottom surface 20b of the base chassis 20 and is fixed to the slider 42 of the slide mechanism 4. Therefore, the base plate 51 moves linearly along with the slider 42 of the slide mechanism 4. The base plate 51 is a base of movement of the slider 52 of the right-and-left tilt mechanism 5 and the support chassis 8.

Therefore, when the base plate 51 is moved by movement of the slide mechanism 4, the entire right-and-left tilt mechanism 5 is moved.

Moreover, the slider 52 includes three shafts 52b. The three shafts 52b are provided to the base plate 51 and engage with three guide grooves 51a running in the back-and-forth direction (the Y-axis direction). Thus, the slider 52 moves in the back-and-forth direction (the Y-axis direction) relative to the base plate 51, along the three guide grooves 51a. As a result, the slider 52 moves substantially parallel to the bottom surface 20b of the base chassis 20.

Further, the slider 52 includes a guide groove 52a. The guide groove 52a is angled as a whole relative to the back-and-forth direction (the Y-axis direction). However, a substantial center portion C of the guide groove 52a runs in the back-and-forth direction (the Y-axis direction).

The support chassis 8 rotates, relative to the base plate 51, on the rotation axis 5a parallel to the up-and-down direction (the Z-axis direction). The support chassis 8 includes a movement following shaft 8a located away from the rotation axis 5a. The movement following shaft 8a engages with the guide groove 52a of the slider 52. Therefore, when the slider 52 moves, the movement following shaft 8a also moves along with the guide groove 52a. The movement of the movement following shaft 8a causes the support chassis 8 to rotate on the rotation axis 5a.

For example, as shown in FIG. 13, when the slider 52 moves from the initial state ST1 to the back side (the −Y side), the movement following shaft 8a moves along the guide groove 52a and is located at a position near a front (the +Y side) end of the guide groove 52a. Thus, the movement following shaft 8a moves in a direction shown by an arrow AR1 from an originally-located initial position P0, and thus the support chassis 8 rotates clockwise in FIG. 13 on the rotation axis 5a. As a result, the angle of the display surface of the display panel 3 supported by the support chassis 8 is changed to the left.

Moreover, as shown in FIG. 14, when the slider 52 moves from the initial state ST1 to the front side (the +Y side), the movement following shaft 8a moves along the guide groove 52a and is located at a position near a back (the −Y side) end of the guide groove 52a. Thus, the movement following shaft 8a moves in a direction shown by an arrow AR2 from the originally-located initial position P0, and thus the support chassis 8 rotates counterclockwise in FIG. 14 on the rotation axis 5a. As a result, the angle of the display surface of the display panel 3 supported by the support chassis 8 is changed to the right.

Further, when the slider 52 moves from a state shown in FIG. 13 or FIG. 14 to a position shown in FIG. 12, the movement following shaft 8a is located at the substantial center portion C of the guide groove 52a. Thus, the movement following shaft 8a moves back to the initial position P0 and the display surface of the display panel 3 faces front. As described above, the substantial center portion C of the guide groove 52a runs in the back-and-forth direction (the Y-axis direction). Thus, even if the slider 52 is located slightly away from an ideal position of the initial state ST1, the movement following shaft 8a can be located at the initial position P0 and the display surface of the display panel 3 can face front. Moreover, the movement following shaft 8a does not move in the direction (shown by the arrow AR1 and the arrow AR2) in which the support chassis 8 is rotated. Therefore, the display surface of the display panel 3 can be kept facing front, even if pressure is applied to the display panel 3 slightly.

Further, the right-and-left tilt mechanism 5 includes a motor 59 that is a driving source to generate driving force and a plurality of gears 54 that convey the driving force of the motor 59. The motor 59 and the plurality of gears 54 are provided to the base plate 51.

The slider 52 includes a rack gear 52g parallel to the back-and-forth direction (the Y-axis direction). The rack gear 52g engages with one of the plurality of gears 54. Therefore, the driving force of the motor 59 is conveyed to the slider 52 via the plurality of gears 54. As the motor 59 rotates, the slider 52 moves along the three guide grooves 51a in the back-and-forth direction (the Y-axis direction).

In addition, the right-and-left tilt mechanism 5 includes a position sensor 58 that detects an angle of the display surface of the display panel 3 changed by the right-and-left tilt mechanism 5. The position sensor 58 is, for example, a variable resistor, and is provided to the base plate 51 and extends in the back-and-forth direction (the Y-axis direction). The position sensor 58 is connected to a projecting portion 52c of the slider 52, and the projecting portion 52c functions as a movable terminal of the variable resistor. Thus, the position sensor 58 detects a position of the slider 52 based on a resistance value that changes according to a position of the projecting portion 52c. The position of the slider 52 is equivalent to the angle of the display surface of the display panel 3 changed by the right-and-left tilt mechanism 5.

The display system 1 can move the slider 52 of the right-and-left tilt mechanism 5 to an arbitrary position within a movable range of the slider 52, by using such a position sensor like the position sensor 58. In other words, the display system 1 can change the angle of the display surface of the display panel 3 to an arbitrary angle within a range where the right-and-left tilt mechanism 5 can adjust the angle of the display surface of the display panel 3. Moreover, the display system 1 can detect the position of the slider 52 by using the position sensor 58 when the display system 1 is turned on.

<5. Up-and-Down Tilt Mechanism>

Figure 15:
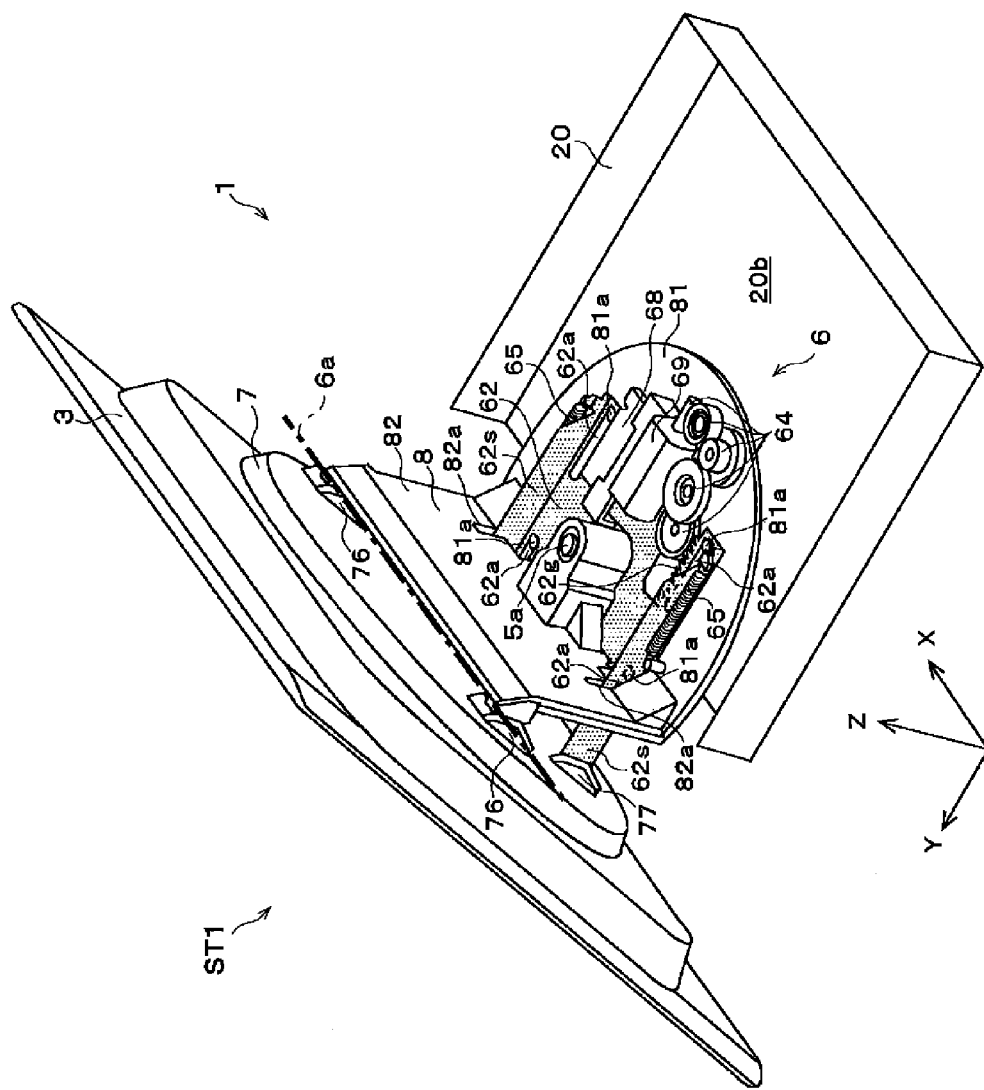
FIG. 15 mainly shows a configuration of the up-and-down tilt mechanism.
Figure 16:
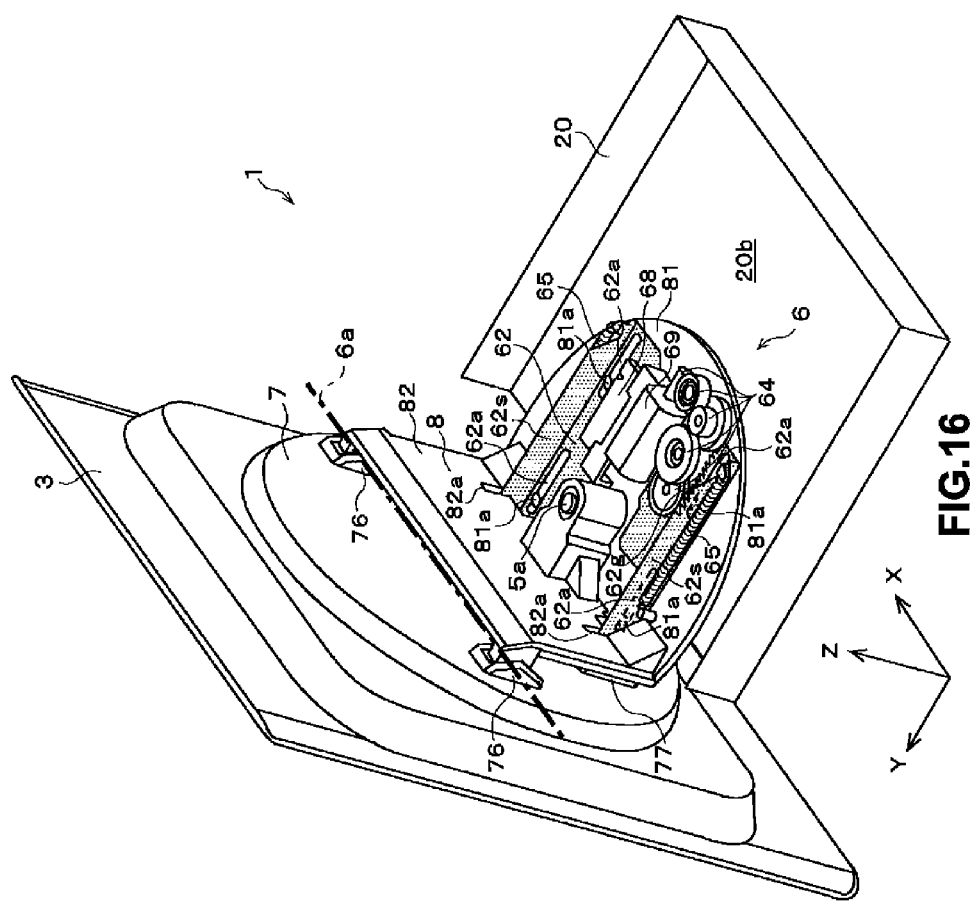
FIG. 16 mainly shows the configuration of the up-and-down tilt mechanism.

Next, the up-and-down tilt mechanism 6 is explained. FIGS. 15 and 16 mainly show the configuration of the up-and-down tilt mechanism 6. FIG. 15 shows the initial state ST1. On the other hand, FIG. 16 shows a state of the display panel 3 of which an angle is changed by the up-and-down tilt mechanism 6 from the initial state ST1. For convenience of explanation, in these drawings, the configuration is shown through some members, and part of the configuration, other than the up-and-down tilt mechanism 6, is omitted from the drawings.

As shown in FIG. 15, the up-and-down tilt mechanism 6 includes a slider 62 that moves linearly relative to the support chassis 8. The support chassis 8 functions as a base member that is a base of movement of the slider 62. Therefore, when the movement of the right-and-left tilt mechanism 5 causes the support chassis 8 to rotate on the rotation axis 5a, the entire up-and-down tilt mechanism 6 rotates. For convenience of explanation, the right-and-left tilt mechanism 5 with the display surface of the display panel 3 facing front (the initial state ST1) is used in the explanation below.

The support chassis 8 is formed by integrating a substantially semicircular base 81 that is provided parallel to the bottom surface 20b of the base chassis 20 and a support plate 82 that stands in the up-and-down direction (the Z-axis direction). An upper section of the support plate 82 is rotatably connected to two right and left first connection portions 76 provided to an upper back side (the −Z side) of the rotation mechanism 7. A line from one of the two first connection portions 76 to the other is the rotation axis 6a used by the up-and-down tilt mechanism 6 to rotate the display panel 3. An angle of the rotation axis 6a is defined by the support chassis 8.

The slider 62 includes four guide grooves 62a running in the back-and-forth direction (the Y-axis direction). Moreover, a fixed shaft 81a fixed to the base 81 of the support chassis 8 is fitted in each of the four guide grooves 62a. Therefore, the slider 62 moves in the back-and-forth direction (the Y-axis direction) along the four guide grooves 62a. Even after the support chassis 8 rotates on the rotation axis 5a, the slider 62 can move substantially parallel to the bottom surface 20b of the base chassis 20. The slider 62 is energized by two springs 65 to the front side (the +Y side).

The slider 62 has a connection plate 62s extendable in the back-and-forth direction (the Y-axis direction) at each of right and left ends of the slider 62. The connection plates 62s project to a front side (the +Y side) of the support plate 82 through through-holes 82a formed in a lower section of the support plate 82. A relatively short grooves (not illustrated) are formed in the up-and-down direction (the Z-axis direction) near front (the +Y side) ends of the connection plates 62s. Further, pins of two right and left second connection portions 77 provided to lower sections of a back side (the −Z side) of the rotation mechanism 7 are fitted in grooves near the ends of the two connection plates 62s, respectively. Therefore, when the connection plates 62s move in the back-and-forth direction (the Y-axis direction) as the slider 62 moves, the second connection portions 77 connected to the connection plates 62s move. The movement of the two second connection portions 77 causes the display panel 3 to rotate on the rotation axis 6a.

For example, when the slider 62 moves to the back side (the −Y side) from the initial state ST1 as shown in FIG. 15, the two second connection portions 77 on the back side (the −Z side) of the rotation mechanism 7 moves to the back side (the −Y side) because the two second connection portions 77 are pulled by the connection plates 62s, as shown in FIG. 16. Thus, the display panel 3 rotates on the rotation axis 6a and the display surface of the display panel 3 turns downwards relatively.

Contrarily, as the slider 62 moves to the front side (the +Y side) from a state shown in FIG. 16, the two second connection portions 77 on the back side (the −Z side) of the rotation mechanism 7 moves to the front side (the +Y side) because the two second connection portions 77 are pushed by the connection plate 62s, as shown in FIG. 15. Thus, the display panel 3 rotates on the rotation axis 6a and the display surface of the display panel 3 turns upwards relatively. As a result, the angle of the display surface of the display panel 3 comes back to the angle of the initial state ST1.

The up-and-down tilt mechanism 6 includes a motor 69 that is a driving source to generate driving force and a plurality of gears 64 that convey the driving force of the motor 69. The motor 69 and the plurality of gears 64 are provided to the base 81 of the support chassis 8.

Moreover, the slider 62 includes a rack gear 62g parallel to the back-and-forth direction (the Y-axis direction). The rack gear 62g engages with one of the plurality of gears 64. Therefore, the driving force of the motor 69 is conveyed to the slider 62 via the plurality of gears 64. As the motor 69 rotates, the slider 62 moves along the four guide grooves 62a in the back-and-forth direction (the Y-axis direction).

In addition, the up-and-down tilt mechanism 6 includes a position sensor 68 that detects an angle of the display surface of the display panel 3 changed by the up-and-down tilt mechanism 6. The position sensor 68 is, for example, a variable resistor, and is provided to the base 81 of the support chassis 8 and extends in the back-and-forth direction (the Y-axis direction). The position sensor 68 is connected to a portion of the slider 62 and the portion functions as a movable terminal of the variable resistor. Thus, the position sensor 68 detects a position of the slider 62 based on a resistance value that changes according to a position of the portion of the slider 62. The position of the slider 62 is equivalent to the angle of the display surface of the display panel 3 changed by the up-and-down tilt mechanism 6.

The display system 1 can move the slider 62 of the up-and-down tilt mechanism 6 to an arbitrary position within a movable range of the slider 62, by using such a position sensor like the position sensor 68. In other words, the display system 1 can change the angle of the display surface of the display panel 3 to an arbitrary angle within a range where the up-and-down tilt mechanism 6 can adjust the angle of the display surface of the display panel 3. Moreover, the display system 1 can detect the position of the slider 62 by using the position sensor 68 when the display system 1 is turned on.

The configurations of the slide mechanism 4, the right-and-left tilt mechanism 5 and the up-and-down tilt mechanism 6 are explained above. As explained above, the slide mechanism 4, the right-and-left tilt mechanism 5 and the up-and-down tilt mechanism 6 include the slider 42, the slider 52 and the slider 62, respectively, that move linearly and that accordingly move the display panel 3. In addition, the three sliders 42, 52 and 62 are all move substantially parallel to the bottom surface 20*b* that is the base surface of the base chassis 20. Therefore, due to the configurations mentioned above, the slide mechanism 4, the right-and-left tilt mechanism 5 and the up-and-down tilt mechanism 6 can be stacked on tope of each other in a same direction. As a result, as described earlier, the mechanisms that move along with the display panel 3 can be reduced and the total weight to be moved by the movement apparatus 2 can be reduced.

<6. Rotation Mechanism>

Figure 17:
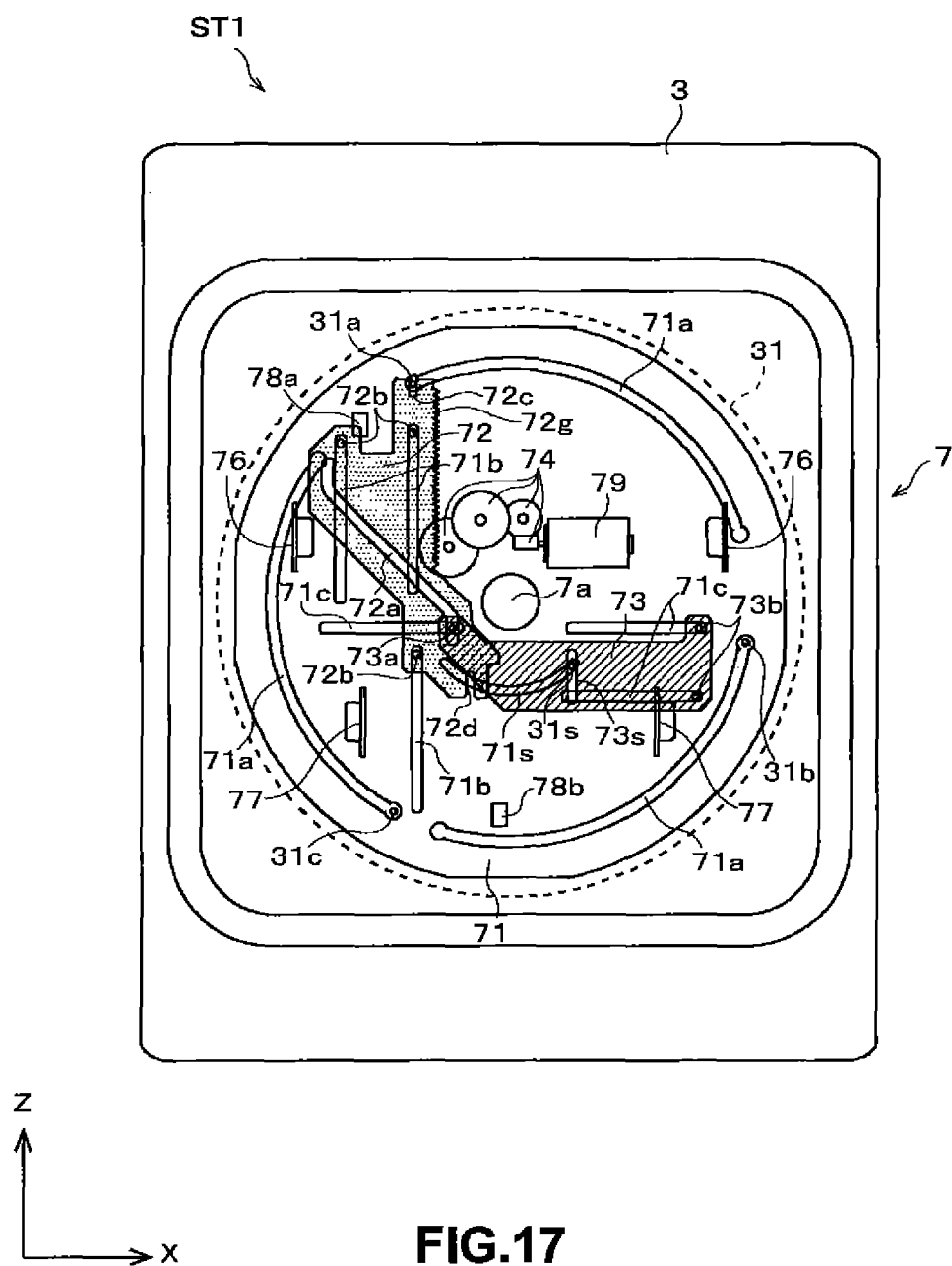
FIG. 17 mainly shows a configuration of the rotation mechanism.
Figure 18:
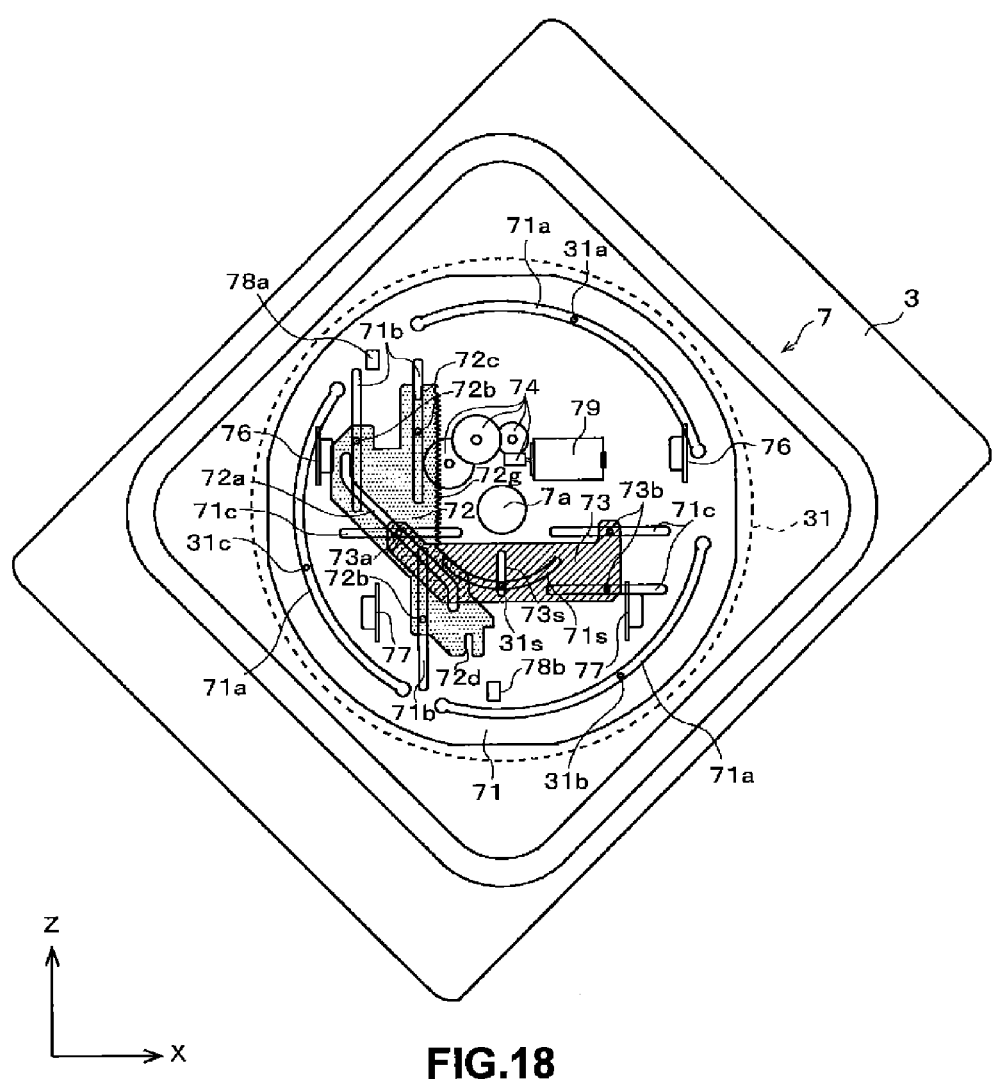
FIG. 18 mainly shows the configuration of the rotation mechanism.
Figure 19:
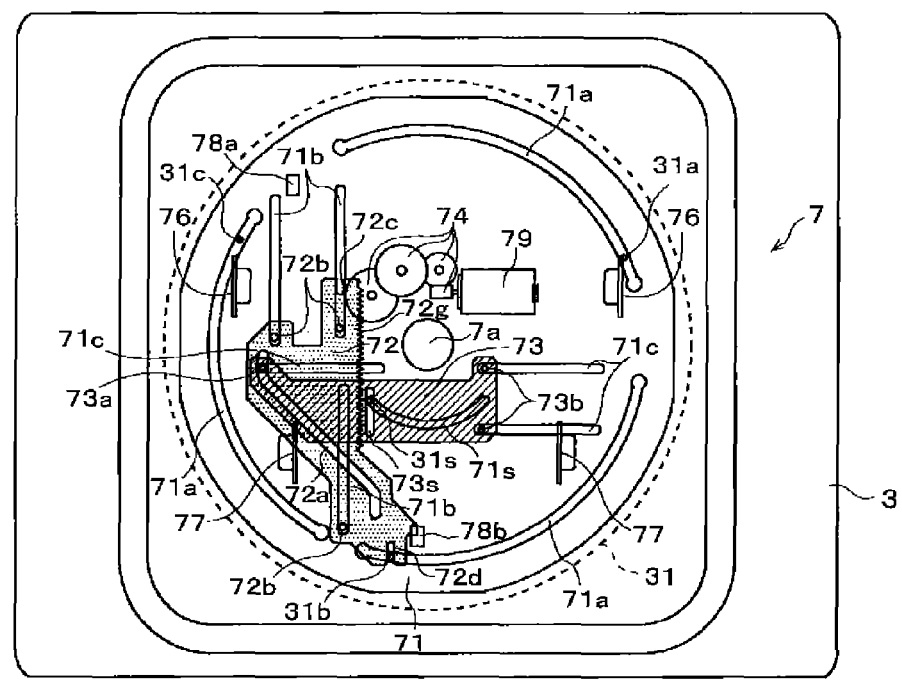
FIG. 19 mainly shows the configuration of the rotation mechanism.

Next, the rotation mechanism 7 is explained. FIGS. 17 to 19 mainly show the configuration of the rotation mechanism 7. These drawings show the configuration of the rotation mechanism 7 viewed from the back side (the −Y side) of the display panel 3. FIG. 17 shows the initial state ST1. On the other hand, each of FIGS. 18 and 19 shows a state of the display panel 3 rotated by the rotation mechanism 7 from the initial state ST1. For convenience of explanation, in these drawings, the configuration is shown through some members.

As shown in FIG. 17, the rotation mechanism 7 includes a base plate 71 that serves as a base member provided substantially parallel to the display surface of the display panel 3. The base plate 71 is connected to the up-and-down tilt mechanism 6 via the first connection portions 76 and the second connection portions 77 mentioned above. Thus, when the angle of the display surface of the display panel 3 is changed by the movement the right-and-left tilt mechanism 5 or the up-and-down tilt mechanism 6, a posture of the entire rotation mechanism 7 is changed. For convenience of explanation, in the explanation below, the display surface of the display panel 3 and the base plate 71 are parallel to a plane defined by the right-and-left direction (the X-axis direction) and the up-and-down direction (the Z-axis direction).

The rotation mechanism 7 is provided substantially parallel to the display surface of the display panel 3 and includes a turn table 31 fixed to the display panel 3. The turn table 31 is rotatably connected to the base plate 71 via the rotation axis 7*a*. Rotation of the turn table 31 causes the display panel 3 to rotate relative to the base plate 71.

The turn table 31 includes three holding shafts 31*a*, 31*b* and 31*c* located relatively away from the rotation axis 7*a* and an action shaft 31*s* located relatively near the rotation axis 7*a*. The three holding shafts 31*a*, 31*b* and 31*c* are respectively fitted in three arc-shaped guide grooves 71*a* provided to the base plate 71. Thus, the turn table 31 is not separated from the base plate 71.

Moreover, the action shaft 31*s* located near the rotation axis 7*a* is also fitted in an arc-shaped guide groove 71*s* provided to the base plate 71 and moves along the guide groove 71*s*. The base plate 71 defines a rotation direction of the rotation axis 7*a*. Thus, a position of the rotation axis 7*a* relative to the base plate 71 is not changed. Therefore, the turn table 31 can be rotated relative to the base plate 71 by moving the action shaft 31*s* to change a relative position of the action shaft 31*s* to the rotation axis 7*a*.

Moreover, the rotation mechanism 7 includes two sliders 72 and 73 that move linearly relative to the base plate 71.

The first slider 72 includes three shafts 72*b*. The three shafts 72*b* are fitted in three guide grooves 71*b* provided parallel to the up-and-down direction (the Z-axis direction) to the base plate 71. Therefore, the first slider 72 moves in the up-and-down direction (the Z-axis direction) along the three guide grooves 71*b* relative to the base plate 71.

The second slider 73 also includes three shafts of a shaft 73*a* and two shafts 73*b*. The three shafts 73*a* and 73*b* are respectively fitted in three guide grooves 71*c* provided parallel to the right-and-left direction (the X-axis direction) to the base plate 71. Therefore, the second slider 73 moves in the right-and-left direction (the X-axis direction) along the three guide grooves 71*c* relative to the base plate 71.

The first slider 72 includes a guide groove 72*a*. The guide groove 72*a* is angled as a whole relative to the up-and-down direction (the Z-axis direction). However, both end portions of the guide groove 72*a* runs in the up-and-down direction (the Z-axis direction). The shaft 73*a* (hereinafter referred to as "movement following shaft") of the shafts included in the second slider 73 is fitted in the guide groove 72*a*. Thus, the movement following shaft 73*a* is fitted both in the guide groove 71*c* of the base plate 71 and the guide groove 72*a* of the first slider 72.

Moreover, the second slider 73 includes a guide groove 73*s* provided parallel to the up-and-down direction (the Z-axis direction). The action shaft 31*s* of the turn table 31 is fitted in the guide groove 73*s*. Thus, the action shaft 31*s* is fitted both in the guide groove 71*s* of the base plate 71 and the guide groove 73*s* of the second slider 73.

As the first slider 72 moves, the movement following shaft 73*a* fitted in the guide groove 72*a* of the first slider 72 moves. The movement of the movement following shaft 73*a* causes the second slider 73 to move. As the second slider 73 moves, the action shaft 31*s* fitted in the guide groove 73*s* of the second slider 73 moves. The movement of the action shaft 31*s* causes the turn table 31 to rotate relative to the base plate 71. In other words, the display panel 3 rotates relative to the base plate 71.

For example, when the first slider 72 moves from the initial state ST1 shown in FIG. 17 to a lower side (the −Z side), the movement following shaft 73*a* moves along the two guide grooves 71*c* and 72*a* shown in FIG. 18 to a left side (the −X side) in the drawing. Thus, the second slider 73 also moves to the left side (the −X side) in the drawing. The movement of the second slider 73 causes the action shaft 31*s* to move clockwise in the drawing in an arc along the two guide grooves 71*s* and 73*s*. As a result, the display panel 3 rotates clockwise in the drawings on the rotation axis 7*a*, relative to the base plate 71.

Moreover, when the first slider 72 moves further to the lower side (the −Z side) from the state shown in FIG. 18, the movement following shaft 73*a*, the second slider 73 and the action shaft 31*s* further moves as shown in FIG. 19. As a result, the display panel 3 rotates clockwise in the drawing by 90 degrees from the initial state ST1 on the rotation axis 7a to be in the landscape mode posture where the longer side of the display surface is parallel to the right-and-left direction (the X-axis direction). When the display panel 3 is in the landscape mode posture, the holding shaft 31b of the turn table 31 is fitted in the fit groove 72d formed in a lower portion of the first slider 72. Thus, the turn table 31 is locked and the display panel 3 stays in the landscape mode posture.

Contrarily, when the first slider 72 moves to an upper side (the +Z side) from the landscape mode posture as shown in FIG. 19, the movement following shaft 73a moves to a right side (the +X side) in the drawing along the two guide grooves 71c and 72a. Thus, the second slider 73 also moves to the right side (the +X side) in the drawing. The action shaft 31s moves counterclockwise in the drawing in an arc along the two guide grooves 71s and 73s by the movement of the second slider 73. As a result, the display panel 3 rotates counterclockwise in the drawings on the rotation axis 7a, relative to the base plate 71.

Moreover, when the first slider 72 moves further to the upper side (the +Z side) from the state shown in FIG. 18, the movement following shaft 73a, the second slider 73 and the action shaft 31s further moves as shown in FIG. 17. As a result, the display panel 3 returns to the portrait mode posture of the initial state ST1 where the shorter side of the display surface is parallel to the right-and-left direction (the X-axis direction). When the display panel 3 is in the portrait mode posture, the holding shaft 31a of the turn table 31 is fitted in the fit groove 72c formed in an upper portion of the first slider 72. Thus, the turn table 31 is locked and the display panel 3 stays in the portrait mode posture.

In addition, the rotation mechanism 7 includes a motor 79 that is a driving source to generate driving force and a plurality of gears 74 that convey the driving force of the motor 79. The motor 79 and the plurality of gears 74 are provided to the base plate 71.

The first slider 72 includes a rack gear 72g parallel to the up-and-down direction (the Z-axis direction). The rack gear 72g engages with one of the plurality of gears 74. Therefore, the driving force of the motor 79 is conveyed to the first slider 72 via the plurality of gears 74. As the motor 79 rotates, the first slider 72 moves along the three guide grooves 71b in the up-and-down direction.

Further, the rotation mechanism 7 includes two position switches 78a and 78b that detect the posture of the display panel 3 changed by the rotation mechanism 7. The upper position switch 78a of the two position switches is provided to an upper portion of the base plate 71. As shown in FIG. 17, the upper position switch 78a is turned on by contact of part of the first slider 72 reaching the upper end of a movable range of the first slider 72. Thus, the upper position switch 78a detects that the display panel 3 is in the portrait mode posture (the initial state ST 1).

On the other hand, the lower position switch 78b is provided to a lower portion of the base plate 71. As shown in FIG. 19, the lower position switch 78b is turned on by contact of part of the first slider 72 reaching the lower end of the movable range of the first slider 72. Thus, the lower position switch 78b detects that the display panel 3 is in the landscape mode posture.

The display system 1 can detect whether the display panel 3 is in the portrait mode posture or the landscape mode posture, by using such a position switch like the upper position switch 78a and the lower position switch 78b. Moreover, when the position switches 78a and 78b are off, the display panel 3 is in a posture of a middle of rotation, not in the portrait mode posture or in the landscape mode posture. In a case where the display system 1 recognizes that the display panel 3 is in the posture of the middle of rotation when the display system 1 is turned on, the display system 1 checks a signal from the position sensors 48, 58 and 68 provided to the other mechanisms 4, 5 and 6 and moves the display panel 3 to one of the portrait mode posture and the landscape mode posture.

<7. Electrical Configuration of Display System>

Figure 20:
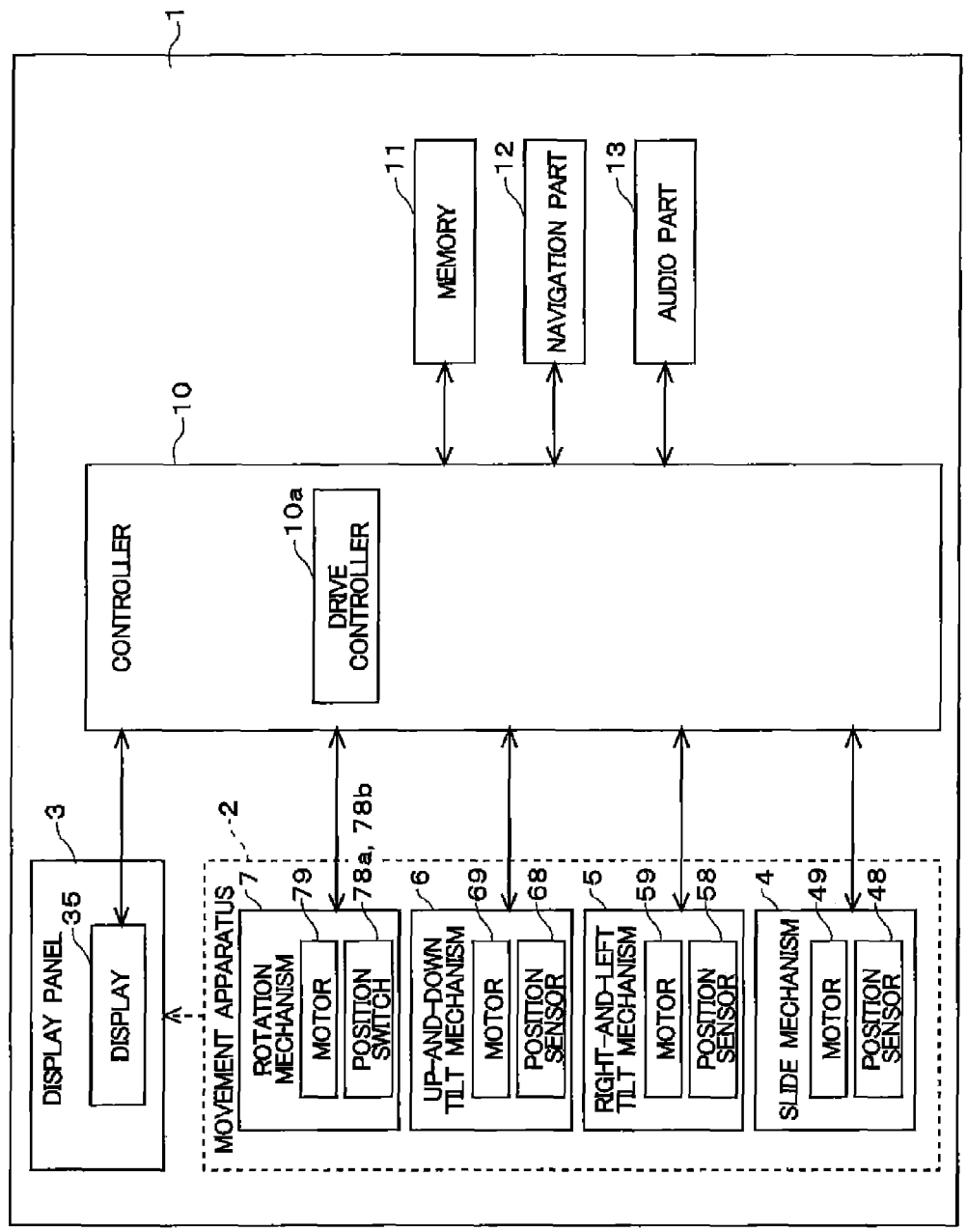
FIG. 20 is a block diagram showing an electrical configuration of the display system.

Next, an electrical configuration of the display system 1 is explained. FIG. 20 is a block diagram showing the electrical configuration of the display system 1.

The display system 1 includes a controller 10, a memory 11, a navigation part 12 and an audio part 13. These electrical processing portions 10 to 13 are, for example, provided to a wiring board in the base chassis 20. However, all or a part of the electrical processing portions 10 to 13 may be provided to the display panel 3.

The memory 11 is a nonvolatile storage device, such as a flash memory, that stores a variety of data. Various data necessary for the display system 1 to operate is stored in the memory 11.

The navigation part 12 implements the navigation function that provides a route to a destination, using a map stored in the memory 11. The audio part 13 implements the audio function that outputs sound to the cabin, using audio data stored in the memory 11.

The controller 10 is a microcomputer including, for example, a CPU, a RAM, and a ROM, and comprehensively controls the entire display system 1. The controller 10 is electrically connected to the display 35 of the display panel 3 and the movement apparatus 2, and also controls operations of the display 35 and the movement apparatus 2.

Various functions of the controller 10 are implemented by the CPU running a program stored beforehand in the memory 11 and the like. A drive controller 10a shown in the drawing is a part of functions implemented by running of the programs.

The drive controller 10a controls operations of the movement apparatus 2. The drive controller 10a controls drive of each of the slide mechanism 4, the right-and-left tilt mechanism 5, the up-and-down tilt mechanism 6 and the rotation mechanism 7 included in the movement apparatus 2.

As shown earlier, the slide mechanism 4, the right-and-left tilt mechanism 5, the up-and-down tilt mechanism 6 and the rotation mechanism 7 include the motors 49, 59, 69 and 79, respectively, which are the driving sources independent of one another. Therefore, the drive controller 10a can drive the four mechanisms 4, 5, 6 and 7 included in the movement apparatus 2, separately from one another. For example, the drive controller 10a can drive the four mechanisms 4, 5, 6 and 7 concurrently.

Moreover, the drive controller 10a receives signals from the position sensors 48, 58 and 68 respectively included in the slide mechanism 4, the right-and-left tilt mechanism 5 and the up-and-down tilt mechanism 6 and signals from the position switches 78a and 78b included in the rotation mechanism 7. Thus, the drive controller 10a can recognize the position, the angle and the posture of the display panel 3.

The drive controller 10a controls the movement apparatus 2 to move the display panel 3 from the initial state ST1 shown in FIG. 2 to a projecting state where the display panel 3 projects to the cabin. In the projecting state, "the position of the display panel 3 moved by the slide mechanism 4," "the angle of the display panel 3 moved by the right-and-left tilt mechanism 5," "the angle of the display panel 3 moved by the up-and-down tilt mechanism 6" and "the posture of the display panel 3 moved by the rotation mechanism 7" can be as desired by the user. Setting data that specifies the position, the angle and the posture of the display panel 3 in the projecting state is stored beforehand in the memory 11.

<8. Operations of Movement Apparatus>

Figure 21:
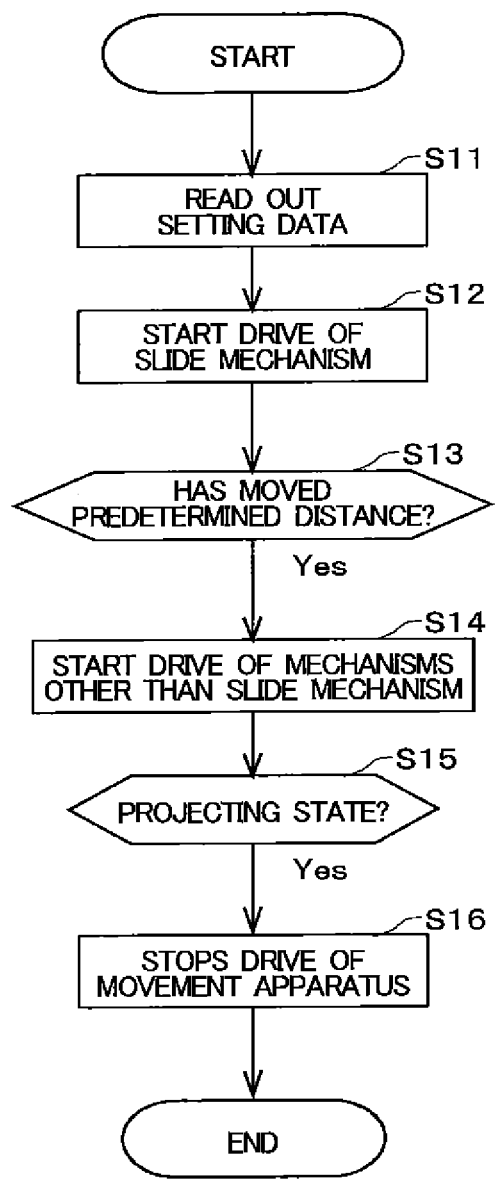
FIG. 21 is a flowchart showing an operation for moving a movement apparatus to a projecting state.

Next, operations in which the drive controller 10a described above controls the movement apparatus 2 are described. First, an operation for moving the movement apparatus 2 from the initial state ST1 to the projecting state is explained. FIG. 21 is a flowchart showing the operation for moving the movement apparatus 2 from the initial state ST1 to the projecting state. This operation is started by the user by giving a predetermined command to the display system 1 via the display panel 3.

First, the drive controller 10a reads out the setting data specifying the position, the angle, and the posture of the display panel 3 in the projecting state from the memory 11 (a step S11).

Next, the drive controller 10a sends a signal to the slide mechanism 4 to start drive of the slide mechanism 4 (a step S12). At this point, the drive controller 10a does not send signals to the right-and-left tilt mechanism 5, the up-and-down tilt mechanism 6 and the rotation mechanism 7, the mechanisms other than the slide mechanism 4, and restrains these mechanisms 5, 6 and 7 from moving the display panel 3. However, the right-and-left tilt mechanism 5, the up-and-down tilt mechanism 6 and the rotation mechanism 7 may prepare to move the display panel 3 without moving the display panel 3.

After the slide mechanism 4 moves the display panel 3 by a predetermined distance (e.g. 20 mm) (Yes in a step S13), the drive controller 10a starts drive of the right-and-left tilt mechanism 5, the up-and-down tilt mechanism 6 and the rotation mechanism 7 (a step S14). As described above, the drive controller 10a restrains the other mechanism 5, 6 and 7 from moving the display panel 3 in part of the movable range of the slide mechanism 4.

Figure 22:
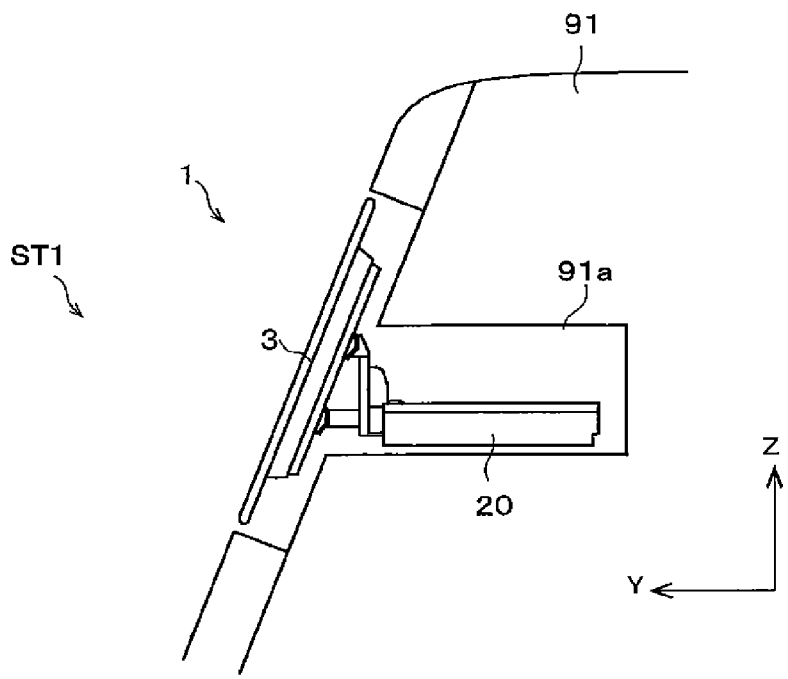
FIG. 22 shows an example of a positional relationship between a display panel and a near object.

As shown in FIG. 22, the display panel 3 is housed in the installation portion 91a in the initial state ST1. Thus, in a case where one of the right-and-left tilt mechanism 5, the up-and-down tilt mechanism 6 and the rotation mechanism 7 is driven in the initial state ST1, there is high possibility that the display panel 3 hits the dashboard 91. As a result, the display panel 3 or the dashboard 91 may be damaged.

Figure 23:
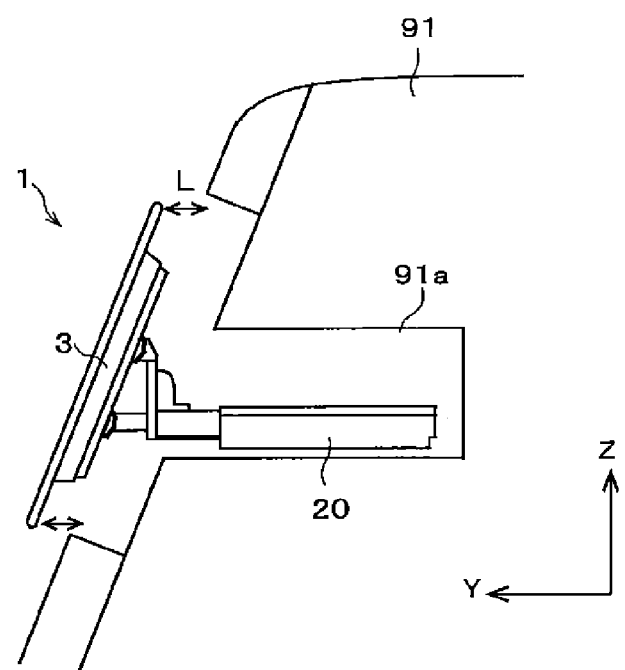
FIG. 23 shows an example of a positional relationship between the display panel and the near object.

Therefore, as shown in FIG. 23, the drive controller 10a restrains the other mechanisms 5, 6 and 7 from moving the display panel 3 in a range L, a range of the predetermined distance from the initial state ST1, within the range where the slide mechanism 4 can move the display panel 3. In other words, the drive controller 10a moves only the slide mechanism 4 in the range L. Thus, it is possible to prevent the display panel 3 from hitting the dashboard 91.

After starting the drive of the right-and-left tilt mechanism 5, the up-and-down tilt mechanism 6 and the rotation mechanism 7, the drive controller 10a moves the four mechanisms 4, 5, 6 and 7 of the movement apparatus 2, concurrently. By moving the four mechanisms 4, 5, 6 and 7 concurrently, the display panel 3 can be moved into the projecting state promptly. Thus, the display panel 3 is moved to the position, the angle and the posture specified by the setting data.

When the display panel 3 becomes the projecting state (Yes in a step S15), the drive controller 10a stops drive of the movement apparatus 2 (a step S16).

In the projecting state, the user can adjust the position, the angle and the posture of the display panel 3 by giving the predetermined command to the display system 1 via the display panel 3. The user can adjust "the position of the display panel 3 moved by the slide mechanism 4," "the angle of the display panel 3 moved by the right-and-left tilt mechanism 5," "the angle of the display panel 3 moved by the up-and-down tilt mechanism 6" and "the posture of the display panel 3 moved by the rotation mechanism 7," separately. Therefore, the position, the angle and the posture of the display panel 3 can be as desired by the user. As a result, visibility and operability of the display panel 3 can be improved.

As mentioned above, the slide mechanism 4, the right-and-left tilt mechanism 5 and the up-and-down tilt mechanism 6 include the position sensors 48, 58 and 68, respectively. Thus, "the position of the display panel 3 moved by the slide mechanism 4," "the angle of the display panel 3 moved by the right-and-left tilt mechanism 5" and "the angle of the display panel 3 moved by the up-and-down tilt mechanism 6" can be adjusted finely.

Figure 24:
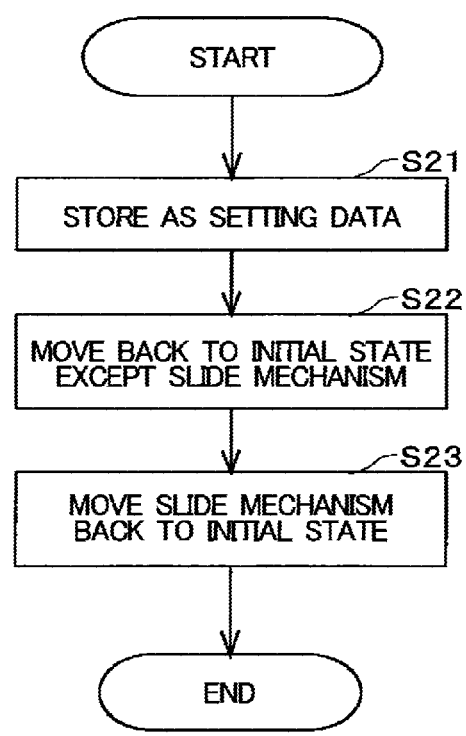
FIG. 24 is a flowchart showing an operation for moving the movement apparatus to the initial state.

Next, an operation for moving the movement apparatus 2 from the projecting state to the initial state ST1 is described. FIG. 24 is a flowchart showing the operation for moving the movement apparatus 2 from the projecting state to the initial state ST1. This operation is started by the user by giving a predetermined command to the display system 1 via the display panel 3.

The position, the angle, and the posture of the display panel 3 at a time of the predetermined command given by the user to start the operation are stored in the memory 11 as the setting data (a step S21). Thus, at a next time of moving the movement apparatus, the position, the angle and the posture of the display panel 3 of the display system 1 can be as adjusted by the user lastly.

Next, the drive controller 10a sends signals to the right-and-left tilt mechanism 5, the up-and-down tilt mechanism 6 and the rotation mechanism 7, other than the slide mechanism 4, to move the angle and the posture of the display panel 3 back to the angle and the posture of the initial state ST1 (a step S22). Then the drive controller 10a sends a signal to the slide mechanism 4 to move the position of the display panel 3 back to the position of the initial state ST1 (a step S23). It is possible to prevent the display panel 3 from hitting the dashboard 91 by moving the slide mechanism 4 last, as shown above, when the display panel 3 is moved to the initial state ST1.

As shown above, the display system 1 of this embodiment includes the display panel 3 that displays information and the movement apparatus 2 that moves the display panel 3. The movement apparatus 2 includes: the slide mechanism 4 that moves the display panel 3 linearly relative to the base chassis 20; the right-and-left tilt mechanism 5 that changes the angle of the display surface of the display panel 3 in the right-and-left direction; the up-and-down tilt mechanism 6 that changes the angle of the display surface of the display panel 3 in the up-and-down direction; and the rotation mechanism 7 that rotates the display panel 3 on the rotation axis 7a orthogonal to the display surface of the display panel 3. Therefore, regardless of an installation position of the display system 1, the position and the angle of the display panel 3 can be changed as desired by the user.

<9. Modifications>

The embodiment of the invention is explained above. However, the invention is not limited to the embodiment described above and various modifications are possible. Some modifications are explained below. All forms including the embodiment described above and the modifications below may be freely combined.

In the aforementioned embodiment, the slide mechanism 4, the right-and-left tilt mechanism 5, the up-and-down tilt mechanism 6 and the rotation mechanism 7 include the driving sources separate from one another. However, all or a part of the mechanisms 4, 5, 6 and 7 may share one or more driving sources. Thus, number of the driving sources can be reduced and thus cost can also be reduces.

Moreover, in the aforementioned embodiment, the positions of the sliders are detected by the position sensors 48, 58 and 68 including variable resistors. However, another method can be used to detect the positions of the sliders. For example, a light projection part and a light reception part are provided to one of a base member and a slider, and plural slits are formed on the other at regular intervals. A distance by which the slide has moved from a predetermined position may be detected based on number of slits that have passed between the light projection part and the light reception part.

In the aforementioned embodiment, the angle of the base surface of the base chassis 20 that is the support structure is parallel to the horizontal direction. However, the base surface of the base chassis 20 may be angled relative to the horizontal direction. Even if the base surface of the base chassis 20 is angled relative to the horizontal direction, the fixed direction of the rotation axis 5a of the right-and-left tilt mechanism 5 can be consistent.

In the aforementioned embodiment, the display system 1 is installed in the installation portion 91a that is the opening formed in the dashboard 91. However, the display system 1 may be installed at another position. For example, the display system 1 may be installed on the dashboard 91 or on a ceiling of the cabin, etc. In a case where the display system 1 is installed on the ceiling and the like of the cabin, the base surface of the support structure of the display system 1 may be parallel to a surface of the ceiling.

In the aforementioned embodiment, the slide mechanism 4 is moved first to prevent the display panel 3 from hitting the dashboard 91. However, if there is no possibility that the display panel 3 hits another object, any of the four mechanisms 4, 5, 6 and 7 may be moved first, and all or a part of the four mechanisms may be started to move at a same time.

Further, the display system 1 may be a system in which the movement apparatus 2 is connected later as an add-on to the display panel 3. In this case, a commonly-used smartphone or a tablet terminal can be used as a display panel 3.

In the aforementioned embodiment, the display system 1 is used in a vehicle such as a car. However, the display system 1 may be a system used at home, at a store, in an office, or in a factory.

In the aforementioned embodiment, the control function is implemented by arithmetic processing of CPU in accordance with a program by software. However a part of the control function may be implemented by an electrical hardware circuit.

While the invention has been shown and described in detail, the foregoing description is in all aspects illustrative and not restrictive. It is therefore understood that numerous other modifications and variations can be devised without departing from the scope of the invention.

What is claimed is:

1. A display system comprising:
a display panel that displays information;
a support structure configured to be mounted to a vehicle;
a linearly-moving mechanism configured to move the display panel linearly relative to the support structure;
a right-and-left changing mechanism configured to change an angle of a display surface of the display panel in a right-and-left direction by causing the display panel to pivot about a first axis;
an up-and-down changing mechanism configured to change an angle of the display surface of the display panel in an up-and-down direction that is orthogonal to the right-and-left direction by causing the display panel to pivot about a second axis that is orthogonal to the first axis; and
a rotation mechanism configured to rotate the display panel on a rotation axis orthogonal to the display surface of the display panel, the rotation axis being different from the first axis and being different from the second axis,
wherein the linearly-moving mechanism includes a first slider, the right-and-left changing mechanism includes a second slider, and the up-and-down changing mechanism includes a third slider, each of the first, second and third sliders moves the display panel by moving linearly substantially parallel to a base surface of the support structure.

2. The display system according to claim 1, wherein
the right-and-left changing mechanism includes:
a rotation member that rotates; and
a base member that defines a fixed direction of a rotation axis of the rotation member, wherein
the up-and-down changing mechanism is provided to a side of the rotation member and the linearly-moving mechanism is provided to a side of the base member.

3. The display system according to claim 1, wherein
the linearly-moving mechanism includes a first driving source, the right-and-left changing mechanism includes a second driving source, the up-and-down changing mechanism includes a third driving source, and the rotation mechanism includes a fourth driving source, each of the first through fourth driving sources is independent of one another.

4. The display system according to claim 1, further comprising:
a controller that controls drive of the right-and-left changing mechanism, the up-and-down changing mechanism and the rotation mechanism, wherein
the controller restrains the right-and-left changing mechanism, the up-and-down changing mechanism and the rotation mechanism from moving the display panel in a part of a movable range of the linearly-moving mechanism.

5. A movement apparatus that moves a display panel, the movement apparatus comprising:
a support structure configured to be mounted to a vehicle;
a linearly-moving mechanism configured to move the display panel linearly relative to the support structure;
a right-and-left changing mechanism configured to change an angle of a display surface of the display panel in a right-and-left direction by causing the display panel to pivot about a first axis;
an up-and-down changing mechanism configured to change an angle of the display surface of the display panel in an up-and-down direction that is orthogonal to the right-and-left direction by causing the display panel to pivot about a second axis that is orthogonal to the first axis; and
a rotation mechanism configured to rotate the display panel on a rotation axis orthogonal to the display surface of the display panel, the rotation axis being different from the first axis and being different from the second axis,
wherein the linearly-moving mechanism includes a first slider, the right-and-left changing mechanism includes a second slider, and the up-and-down changing mechanism includes a third slider, each of the first, second and third sliders moves the display panel by moving linearly substantially parallel to a base surface of the support structure.

6. The movement apparatus according to claim 5, wherein the right-and-left changing mechanism includes:

a rotation member that rotates; and a base member that defines a fixed direction of a rotation axis of the rotation member, wherein the up-and-down changing mechanism is provided to a side of the rotation member and the linearly-moving mechanism is provided to a side of the base member.

7. The movement apparatus according to claim 5, wherein the linearly-moving mechanism includes a first driving source, the right-and-left changing mechanism includes a second driving source, the up-and-down changing mechanism includes a third driving source, and the rotation mechanism includes a fourth driving source, each of the first through fourth driving sources is independent of one another.

8. The movement apparatus according to claim 5, further comprising:

a controller that controls drive of the right-and-left changing mechanism, the up-and-down changing mechanism and the rotation mechanism, wherein the controller restrains the right-and-left changing mechanism, the up-and-down changing mechanism and the rotation mechanism from moving the display panel in a part of a movable range of the linearly-moving mechanism.

9. The display system according to claim 1, wherein a direction of the first axis remains fixed when the up-and-down changing mechanisms causes the display panel to pivot about the second axis and when the rotation mechanism rotates the display panel on the rotation axis.

10. The movement apparatus according to claim 5, wherein a direction of the first axis remains fixed when the up-and-down changing mechanisms causes the display panel to pivot about the second axis and when the rotation mechanism rotates the display panel on the rotation axis.

\* \* \* \* \*